(12) United States Patent
Bdeir

(10) Patent No.: US 12,349,275 B2
(45) Date of Patent: Jul. 1, 2025

(54) MODULAR ELECTRONIC BUILDING SYSTEMS WITH MAGNETIC INTERCONNECTIONS AND METHODS OF USING THE SAME

(71) Applicant: SPHERO, INC., Boulder, CO (US)

(72) Inventor: Aya Bdeir, New York, NY (US)

(73) Assignee: SPHERO, INC., Greenville, TX (US)

( * ) Notice: Subject to any disclaimer, the term of this patent is extended or adjusted under 35 U.S.C. 154(b) by 0 days.

(21) Appl. No.: 17/662,533

(22) Filed: May 9, 2022

(65) Prior Publication Data
US 2022/0377890 A1 Nov. 24, 2022

Related U.S. Application Data

(63) Continuation of application No. 16/360,827, filed on Mar. 21, 2019, now Pat. No. 11,330,714, which is a
(Continued)

(51) Int. Cl.
*H05K 1/14* (2006.01)
*A63H 33/04* (2006.01)
(Continued)

(52) U.S. Cl.
CPC ............. *H05K 1/14* (2013.01); *A63H 33/042* (2013.01); *A63H 33/046* (2013.01); *A63H 33/26* (2013.01);
(Continued)

(58) Field of Classification Search
CPC .......... H05K 1/14; H05K 1/0213; H05K 1/18; A63H 33/042; A63H 33/046; A63H 33/26;
(Continued)

(56) References Cited

U.S. PATENT DOCUMENTS

| 2,493,697 A | 1/1950 | Raczkowski |
| 2,879,685 A | 3/1959 | Page |

(Continued)

FOREIGN PATENT DOCUMENTS

| CN | 3087332 | 10/1998 |
| CN | 3168690 | 12/2000 |

(Continued)

OTHER PUBLICATIONS

"Little Bits' electric LEGOs get supercharged with new cash," The Verge, Jul. 18, 2012 (online), [Retrieved on Jul. 7, 2017], Retrieved from the Internet: <URL: https://web.archive.org/web/20120820112825/ https://www.theverge.com/2012/7/18/3167296/littlebits-electrical-legos-funding.
(Continued)

*Primary Examiner* — Anthony M Haughton
*Assistant Examiner* — Hung Q Dang

(57) ABSTRACT

Electrical connectors, electrical modules, and systems are provided. In one aspect, an electrical connector includes a housing defining a side surface, an electrical conductor supported by the housing and including an engagement portion proximate the side surface of the housing. The engagement portion is adapted to engage another electrical conductor of another electrical connector. The connector also includes a magnet supported by the housing proximate the side surface of the housing, a projection extending from the side surface of the housing, and a receptacle defined in the side surface of the housing. In other aspects, an electrical module includes at least one of these electrical connectors. In further aspects, a system includes a plurality of these modules and the modules are selectively couplable together.

20 Claims, 18 Drawing Sheets

Related U.S. Application Data continuation of application No. 15/463,510, filed on Mar. 20, 2017, now Pat. No. 10,244,630, which is a continuation of application No. 13/975,923, filed on Aug. 26, 2013, now Pat. No. 9,597,607, which is a continuation-in-part of application No. 13/593,891, filed on Aug. 24, 2012, now Pat. No. 9,019,718.

(60) Provisional application No. 61/728,103, filed on Nov. 19, 2012, provisional application No. 61/527,860, filed on Aug. 26, 2011.

(51) Int. Cl.
| | |
|---|---|
| A63H 33/26 | (2006.01) |
| G09B 19/00 | (2006.01) |
| G09B 23/18 | (2006.01) |
| H01R 9/24 | (2006.01) |
| H01R 12/71 | (2011.01) |
| H01R 12/73 | (2011.01) |
| H01R 13/62 | (2006.01) |
| H05K 1/02 | (2006.01) |
| H05K 1/18 | (2006.01) |

(52) U.S. Cl.
CPC ....... *G09B 19/0053* (2013.01); *G09B 23/186* (2013.01); *H01R 9/2466* (2013.01); *H01R 12/718* (2013.01); *H01R 12/732* (2013.01); *H01R 13/6205* (2013.01); *H05K 1/0213* (2013.01); *H05K 1/18* (2013.01)

(58) Field of Classification Search
CPC .. A63H 33/08; G09B 19/0053; G09B 23/186; H01R 9/2466; H01R 12/718; H01R 12/732; H01R 13/6205; H01R 12/722; H01R 13/2407; H01R 2105/00
See application file for complete search history.

(56) References Cited

U.S. PATENT DOCUMENTS

| | | |
|---|---|---|
| 2,947,914 A | 8/1960 | Simons |
| 3,005,282 A | 10/1961 | Godtfred |
| 3,008,245 A | 11/1961 | Meuche |
| 3,034,254 A | 5/1962 | Godtfred |
| 3,205,407 A | 9/1965 | Orville |
| 3,553,438 A | 1/1971 | Blitz et al. |
| 3,594,689 A | 7/1971 | Hopt et al. |
| 3,603,025 A | 9/1971 | Heubl |
| 3,640,018 A | 2/1972 | Light |
| 3,659,219 A | 4/1972 | Rueff, Jr. |
| 3,803,531 A | 4/1974 | Sorensen |
| 3,862,512 A | 1/1975 | Vogel |
| 3,863,931 A | 2/1975 | Forsyth et al. |
| 3,877,028 A | 4/1975 | Thomas |
| 3,970,805 A | 7/1976 | Thomas |
| 4,021,252 A | 5/1977 | Banczak et al. |
| D244,632 S | 6/1977 | Christiansen |
| 4,053,159 A | 10/1977 | Kulak |
| 4,064,377 A | 12/1977 | Regan |
| 4,158,921 A | 6/1979 | Stolpen |
| 4,181,824 A | 1/1980 | Seidel |
| 4,183,173 A | 1/1980 | Ogawa |
| 4,211,456 A | 7/1980 | Sears |
| 4,233,778 A | 11/1980 | Lemelson |
| 4,284,123 A | 8/1981 | Ploeckinger et al. |
| 4,285,563 A | 8/1981 | Crosier et al. |
| 4,314,236 A | 2/1982 | Mayer et al. |
| 4,323,243 A | 4/1982 | Hanson et al. |
| 4,348,191 A | 9/1982 | Lipsitz et al. |
| D267,895 S | 2/1983 | Petrie |
| 4,376,538 A | 3/1983 | Keenan |
| 4,449,942 A | 5/1984 | Salit |
| 4,456,321 A | 6/1984 | Jones et al. |
| 4,496,149 A | 1/1985 | Schwartzberg |
| 4,510,210 A | 4/1985 | Hunt |
| 4,516,260 A | 5/1985 | Breedlove et al. |
| 4,538,675 A | 9/1985 | Welsh |
| 4,542,784 A | 9/1985 | Welsh |
| 4,546,267 A | 10/1985 | Urfirer |
| 4,547,027 A | 10/1985 | Scheibenreif |
| 4,552,541 A | 11/1985 | Bolli |
| 4,556,272 A | 12/1985 | Briones |
| 4,556,393 A | 12/1985 | Bolli |
| 4,578,649 A | 3/1986 | Shupe |
| 4,606,732 A | 8/1986 | Lyman |
| 4,712,184 A | 12/1987 | Haugerud |
| 4,736,367 A | 4/1988 | Wroblewski et al. |
| 4,743,202 A | 5/1988 | Bach |
| 4,796,891 A | 1/1989 | Milner |
| 4,820,233 A | 4/1989 | Weiner |
| 4,838,794 A | 6/1989 | Coddington |
| 4,840,602 A | 6/1989 | Rose |
| 4,846,687 A | 7/1989 | White et al. |
| 4,853,884 A | 8/1989 | Brown et al. |
| 4,874,176 A | 10/1989 | Auerbach |
| 4,878,848 A | 11/1989 | Ingalsbe |
| 4,883,440 A | 11/1989 | Bolli |
| 4,890,241 A | 12/1989 | Hoffman et al. |
| 4,893,817 A | 1/1990 | Shilo |
| 4,905,176 A | 2/1990 | Schulz |
| 4,910,396 A | 3/1990 | Grove |
| 4,936,780 A | 6/1990 | Cogliano |
| 4,937,811 A | 6/1990 | Harris |
| 4,964,833 A | 10/1990 | Suzuki |
| 4,968,255 A | 11/1990 | Lee et al. |
| 4,969,827 A | 11/1990 | Hahs, Jr. |
| 4,978,317 A | 12/1990 | Pocrass |
| 5,013,276 A | 5/1991 | Garfinkel |
| 5,088,951 A | 2/1992 | Majurinen |
| 5,090,701 A | 2/1992 | Chang |
| D324,551 S | 3/1992 | Skov |
| 5,172,534 A | 12/1992 | Milner et al. |
| 5,190,287 A | 3/1993 | Ishiyama |
| 5,191,276 A | 3/1993 | Zainaleain |
| 5,203,711 A | 4/1993 | Bogiel |
| 5,205,758 A | 4/1993 | Comerci et al. |
| D335,508 S | 5/1993 | Skov |
| 5,227,232 A | 7/1993 | Lim |
| 5,236,375 A | 8/1993 | Kachlic |
| D339,613 S | 9/1993 | Pirnat |
| 5,244,403 A | 9/1993 | Smith et al. |
| 5,255,158 A | 10/1993 | Kosugi |
| 5,275,567 A | 1/1994 | Whitfield |
| 5,281,154 A | 1/1994 | Comerci et al. |
| 5,304,069 A | 4/1994 | Brunker et al. |
| 5,319,241 A | 6/1994 | Lim |
| 5,345,221 A | 9/1994 | Pons et al. |
| 5,349,129 A | 9/1994 | Wisniewski et al. |
| D352,750 S | 11/1994 | Kushner et al. |
| 5,371,355 A | 12/1994 | Wodecki |
| D354,318 S | 1/1995 | Ryaa et al. |
| 5,380,951 A | 1/1995 | Comerci et al. |
| 5,385,344 A | 1/1995 | Miller et al. |
| 5,409,227 A | 4/1995 | Walker |
| 5,423,684 A | 6/1995 | Ishikawa |
| 5,445,552 A | 8/1995 | Hine |
| 5,447,433 A | 9/1995 | Perry, Jr. |
| 5,451,178 A | 9/1995 | Yorozu et al. |
| 5,452,201 A | 9/1995 | Pieronek et al. |
| 5,455,749 A | 10/1995 | Ferber |
| 5,459,283 A | 10/1995 | Birdwell, Jr. |
| 5,462,443 A | 10/1995 | Kurbjuhn et al. |
| 5,463,486 A | 10/1995 | Stevens |
| 5,467,102 A | 11/1995 | Kuno et al. |
| 5,469,331 A | 11/1995 | Conway et al. |
| D365,756 S | 1/1996 | Rask et al. |
| 5,512,710 A | 4/1996 | Schroeder |
| D370,035 S | 5/1996 | Olsen |
| D371,583 S | 7/1996 | Knudsen |
| 5,547,399 A | 8/1996 | Naghi et al. |
| 5,547,933 A | 8/1996 | Lin |

(56) References Cited

U.S. PATENT DOCUMENTS

| | | |
|---|---|---|
| 5,558,542 A | 9/1996 | O'Sullivan et al. |
| D374,257 S | 10/1996 | Schmidt et al. |
| 5,563,771 A | 10/1996 | Bethurum |
| 5,574,312 A | 11/1996 | Bayerer et al. |
| 5,580,283 A | 12/1996 | O'Sullivan et al. |
| 5,596,233 A | 1/1997 | Leiber et al. |
| 5,607,336 A | 3/1997 | Lebensfeld et al. |
| 5,610,931 A | 3/1997 | Huang |
| D378,837 S | 4/1997 | Flemming et al. |
| 5,645,463 A | 7/1997 | Olsen |
| 5,648,892 A | 7/1997 | Wieloch et al. |
| 5,651,685 A | 7/1997 | Brinkman et al. |
| 5,658,155 A | 8/1997 | McFarlane et al. |
| 5,661,470 A | 8/1997 | Karr |
| 5,663,938 A | 9/1997 | Dang et al. |
| 5,667,411 A | 9/1997 | O'Sullivan et al. |
| D385,926 S | 11/1997 | Nielsen |
| 5,697,829 A | 12/1997 | Chainani et al. |
| 5,703,761 A | 12/1997 | Heiss |
| D389,408 S | 1/1998 | Rask et al. |
| 5,705,853 A | 1/1998 | Faller et al. |
| 5,721,496 A | 2/1998 | Farnworth et al. |
| 5,722,861 A | 3/1998 | Wetter |
| 5,724,074 A | 3/1998 | Chainani et al. |
| 5,739,050 A | 4/1998 | Farnworth |
| 5,742,169 A | 4/1998 | Akram et al. |
| 5,742,486 A | 4/1998 | Yangkuai |
| 5,746,638 A | 5/1998 | Shiraishi |
| 5,747,940 A | 5/1998 | Openiano |
| 5,766,077 A | 6/1998 | Hongo |
| 5,779,515 A | 7/1998 | Chung |
| 5,799,067 A | 8/1998 | Kikinis et al. |
| RE35,896 E | 9/1998 | Brunker et al. |
| 5,812,397 A | 9/1998 | Pech et al. |
| 5,838,161 A | 11/1998 | Akram et al. |
| 5,841,360 A | 11/1998 | Binder |
| 5,845,503 A | 12/1998 | Choi |
| 5,848,503 A | 12/1998 | Toft et al. |
| 5,850,581 A | 12/1998 | Roller |
| 5,853,327 A | 12/1998 | Gilboa |
| 5,872,354 A | 2/1999 | Hanson |
| 5,901,263 A | 5/1999 | Gaio et al. |
| 5,902,155 A | 5/1999 | Polgar et al. |
| 5,921,864 A | 7/1999 | Walker et al. |
| 5,947,787 A | 9/1999 | Cyrus et al. |
| 5,949,010 A | 9/1999 | Hacker |
| 5,956,046 A | 9/1999 | Kehlet et al. |
| 5,966,526 A | 10/1999 | Yokoi |
| 5,971,855 A | 10/1999 | Ng |
| 5,984,756 A | 11/1999 | Krog |
| 6,024,626 A | 2/2000 | Mendelsohn |
| 6,030,270 A | 2/2000 | Krog |
| 6,062,937 A | 5/2000 | Kikuchi |
| 6,099,353 A | 8/2000 | Wu |
| 6,102,766 A | 8/2000 | Leadbetter et al. |
| 6,110,000 A | 8/2000 | Ting |
| 6,132,281 A | 10/2000 | Klitsner et al. |
| 6,147,552 A | 11/2000 | Sauer |
| 6,165,068 A | 12/2000 | Sonoda et al. |
| 6,168,494 B1 | 1/2001 | Engel et al. |
| 6,171,168 B1 | 1/2001 | Jessop |
| 6,190,174 B1 | 2/2001 | Lam |
| 6,206,745 B1 | 3/2001 | Gabai et al. |
| 6,213,871 B1 | 4/2001 | Yokoi |
| 6,222,665 B1 | 4/2001 | Neuner et al. |
| 6,227,931 B1 | 5/2001 | Shackelford |
| 6,227,966 B1 | 5/2001 | Yokoi |
| 6,233,502 B1 | 5/2001 | Yim |
| 6,236,796 B1 | 5/2001 | Tamura et al. |
| 6,237,914 B1 | 5/2001 | Saltanov et al. |
| 6,271,453 B1 | 8/2001 | Hacker |
| 6,280,278 B1 | 8/2001 | Wells |
| 6,290,565 B1 | 9/2001 | Galyean et al. |
| 6,297,785 B1 | 10/2001 | Sommer et al. |
| 6,306,039 B1 | 10/2001 | Kaji et al. |
| 6,380,844 B2 | 4/2002 | Pelekis |
| 6,422,941 B1 | 7/2002 | Thorner et al. |
| 6,425,581 B1 | 7/2002 | Barrett |
| 6,438,456 B1 | 8/2002 | Feddema et al. |
| 6,443,796 B1 | 9/2002 | Shackelford |
| 6,454,624 B1 | 9/2002 | Duff et al. |
| 6,469,901 B1 | 10/2002 | Costner |
| 6,477,444 B1 | 11/2002 | Bennett et al. |
| 6,477,593 B1 | 11/2002 | Khosrowpour et al. |
| 6,478,583 B1 | 11/2002 | Standiford et al. |
| 6,480,510 B1 | 11/2002 | Binder |
| 6,505,087 B1 | 1/2003 | Lucas et al. |
| 6,527,611 B2 | 3/2003 | Cummings |
| 6,535,907 B1 | 3/2003 | Hachiya et al. |
| D473,849 S | 4/2003 | Yeh |
| 6,540,606 B1 | 4/2003 | Matsukata |
| 6,540,614 B1 | 4/2003 | Nishino et al. |
| 6,560,511 B1 | 5/2003 | Yokoo et al. |
| 6,563,413 B1 | 5/2003 | Ponweiser et al. |
| 6,569,018 B2 | 5/2003 | Jaffe |
| 6,574,234 B1 | 6/2003 | Myer et al. |
| 6,575,802 B2 | 6/2003 | Yim et al. |
| 6,579,178 B1 | 6/2003 | Walker et al. |
| 6,585,553 B1 | 7/2003 | Fetridge et al. |
| 6,605,914 B2 | 8/2003 | Yim et al. |
| 6,611,537 B1 | 8/2003 | Edens et al. |
| 6,628,244 B1 | 9/2003 | Hirosawa et al. |
| 6,629,771 B2 | 10/2003 | Chiu |
| 6,634,920 B1 | 10/2003 | Michaelsen |
| 6,652,383 B1 | 11/2003 | Sonoda et al. |
| 6,679,751 B1 | 1/2004 | Maxwell et al. |
| 6,682,230 B1 | 1/2004 | Demangone et al. |
| 6,682,392 B2 | 1/2004 | Chan |
| 6,687,128 B2 | 2/2004 | Tokuhara |
| 6,692,001 B2 | 2/2004 | Romano |
| 6,692,310 B2 | 2/2004 | Zaderej et al. |
| 6,719,603 B2 | 4/2004 | Chan |
| 6,725,128 B2 | 4/2004 | Hogg et al. |
| 6,727,177 B1 | 4/2004 | Catabay et al. |
| 6,752,680 B1 | 6/2004 | Hansen |
| 6,761,609 B1 | 7/2004 | Andersen |
| 6,773,322 B2 | 8/2004 | Gabai et al. |
| 6,795,318 B2 | 9/2004 | Haas et al. |
| 6,796,808 B2 | 9/2004 | Hosoe et al. |
| 6,805,605 B2 | 10/2004 | Reining et al. |
| 6,819,304 B2 | 11/2004 | Branson |
| 6,850,426 B2 | 2/2005 | Kojori et al. |
| 6,893,316 B2 | 5/2005 | Maxwell et al. |
| 6,902,461 B1 | 6/2005 | Munch et al. |
| 6,931,656 B1 | 8/2005 | Eshelman et al. |
| 6,939,192 B1 | 9/2005 | Munch et al. |
| 6,940,783 B2 | 9/2005 | Fox et al. |
| 6,952,196 B2 | 10/2005 | Weil et al. |
| 6,956,826 B1 | 10/2005 | Binder |
| 6,965,298 B2 | 11/2005 | Feinberg |
| 6,967,274 B2 | 11/2005 | Hanington |
| 6,970,145 B1 | 11/2005 | Aoki |
| 6,979,245 B1 | 12/2005 | Goodwin |
| 6,988,008 B2 | 1/2006 | Hudson et al. |
| 7,008,324 B1 | 3/2006 | Johnson et al. |
| 7,044,825 B2 | 5/2006 | Glickman et al. |
| 7,066,778 B2 | 6/2006 | Kretzschmar |
| 7,089,083 B2 | 8/2006 | Yokoo et al. |
| 7,089,333 B2 | 8/2006 | Marinescu et al. |
| 7,104,863 B2 | 9/2006 | Mimlitch et al. |
| 7,124,157 B2 | 10/2006 | Ikake |
| 7,144,255 B2 | 12/2006 | Seymour |
| 7,145,933 B1 | 12/2006 | Szajnowski |
| 7,170,468 B2 | 1/2007 | Knopf |
| 7,184,272 B1 | 2/2007 | Harlacher et al. |
| 7,184,718 B2 | 2/2007 | Newman et al. |
| 7,196,676 B2 | 3/2007 | Nakamura et al. |
| 7,234,941 B2 | 6/2007 | Shuler et al. |
| 7,238,026 B2 | 7/2007 | Brown et al. |
| 7,242,369 B2 | 7/2007 | Huang |
| 7,273,377 B2 | 9/2007 | Seymour |
| 7,275,937 B2 | 10/2007 | Ellison |
| 7,297,045 B2 | 11/2007 | Pierson et al. |
| 7,311,526 B2 | 12/2007 | Rohrbach et al. |

(56) References Cited

U.S. PATENT DOCUMENTS

| | | |
|---|---|---|
| 7,316,567 B2 | 1/2008 | Hsieh et al. |
| 7,322,873 B2 | 1/2008 | Rosen et al. |
| 7,331,793 B2 | 2/2008 | Hernandez et al. |
| 7,333,328 B2 | 2/2008 | Funawatari et al. |
| 7,344,380 B2 | 3/2008 | Neidlein et al. |
| 7,347,760 B2 | 3/2008 | Wood et al. |
| 7,369,399 B2 | 5/2008 | Richardson |
| 7,370,974 B2 | 5/2008 | Yamada et al. |
| 7,371,177 B2 | 5/2008 | Ellis et al. |
| 7,414,186 B2 | 8/2008 | Scarpa et al. |
| D576,208 S | 9/2008 | Quercetti |
| 7,427,066 B1 | 9/2008 | Goodwin |
| D585,096 S | 1/2009 | Lin |
| 7,507,136 B2 | 3/2009 | Patton |
| 7,508,141 B2 | 3/2009 | Wong |
| 7,510,457 B2 | 3/2009 | Hussa-Lietz |
| 7,511,454 B1 | 3/2009 | Legg |
| 7,541,907 B2 | 6/2009 | Wang et al. |
| 7,555,409 B1 | 6/2009 | Bhaskar et al. |
| 7,555,658 B2 | 6/2009 | Vahid et al. |
| 7,556,563 B2 | 7/2009 | Ellis et al. |
| 7,584,565 B2 | 9/2009 | Zebersky |
| 7,585,216 B2 | 9/2009 | Foster |
| 7,596,473 B2 | 9/2009 | Hansen et al. |
| 7,611,357 B2 | 11/2009 | Han et al. |
| 7,641,477 B2 | 1/2010 | DiFonzo et al. |
| 7,645,143 B2 | 1/2010 | Rohrbach et al. |
| 7,666,054 B2 | 2/2010 | Glickman et al. |
| D614,250 S | 4/2010 | Frederiksen |
| 7,695,338 B2 | 4/2010 | Dooley et al. |
| 7,708,615 B2 | 5/2010 | Munch |
| 7,794,272 B1 | 9/2010 | Hiatt et al. |
| 7,811,150 B2 | 10/2010 | Amireh et al. |
| 7,819,114 B2 | 10/2010 | Augenbraun et al. |
| 7,828,556 B2 | 11/2010 | Rodrigues |
| 7,846,002 B1 | 12/2010 | Mikesell et al. |
| 7,893,845 B2 | 2/2011 | Ritzau |
| D635,190 S | 3/2011 | Merrill et al. |
| 7,909,697 B2 | 3/2011 | Zheng |
| 7,942,717 B2 | 5/2011 | Chou |
| 7,952,322 B2 | 5/2011 | Partovi et al. |
| 7,988,561 B1 | 8/2011 | Lenkarski et al. |
| 7,996,111 B2 | 8/2011 | Cheng et al. |
| 8,016,636 B2 | 9/2011 | Park |
| 8,038,532 B2 | 10/2011 | Neervoort et al. |
| 8,047,889 B2 | 11/2011 | Ishii |
| 8,052,299 B2 | 11/2011 | Lin |
| 8,057,233 B2 | 11/2011 | Owen |
| 8,061,713 B2 | 11/2011 | Cook |
| 8,079,890 B2 | 12/2011 | Seligman |
| 8,087,939 B2 | 1/2012 | Rohrbach et al. |
| 8,091,892 B2 | 1/2012 | Sternberg |
| D658,586 S | 5/2012 | Lin |
| 8,206,159 B2 | 6/2012 | Naito et al. |
| 8,210,860 B2 | 7/2012 | Fukuda |
| 8,221,182 B2 | 7/2012 | Seymour et al. |
| 8,243,438 B2 | 8/2012 | Wang et al. |
| 8,246,386 B1 | 8/2012 | Devito et al. |
| 8,257,157 B2 | 9/2012 | Polchin |
| 8,321,782 B1 | 11/2012 | Broucek |
| 8,348,678 B2 | 1/2013 | Hardisty et al. |
| 8,406,007 B1 | 3/2013 | Folker et al. |
| 8,491,312 B2 | 7/2013 | Rudisill et al. |
| 8,528,905 B2 | 9/2013 | Bianco |
| 8,567,149 B2 | 10/2013 | Kuzmin |
| 8,573,596 B2 | 11/2013 | Gearty |
| 8,576,031 B2 | 11/2013 | Lauder et al. |
| 8,602,833 B2 | 12/2013 | Binder |
| 8,616,948 B2 | 12/2013 | Sherin et al. |
| 8,690,631 B2 * | 4/2014 | Nag ............ A63H 33/086 446/128 |
| 8,753,164 B2 | 6/2014 | Hansen et al. |
| 8,932,123 B2 | 1/2015 | Murayama et al. |
| 8,951,088 B2 | 2/2015 | Binder |
| 8,992,267 B2 | 3/2015 | Bayerer |
| 9,019,718 B2 | 4/2015 | Bdeir |
| D732,475 S | 6/2015 | Bdeir |
| D751,988 S | 3/2016 | Bdeir |
| D752,519 S | 3/2016 | Bdeir |
| 9,419,378 B2 | 8/2016 | Bdeir |
| D773,992 S | 12/2016 | Krantz et al. |
| 9,597,607 B2 * | 3/2017 | Bdeir ............... H05K 1/0213 |
| 9,831,599 B2 | 11/2017 | Bdeir |
| D811,339 S | 2/2018 | Bdeir |
| 10,155,153 B2 | 12/2018 | Binder |
| 10,244,630 B2 * | 3/2019 | Bdeir ............... H05K 1/18 |
| 10,256,568 B2 | 4/2019 | Bdeir |
| 11,330,714 B2 * | 5/2022 | Bdeir ............... A63H 33/26 |
| 2002/0058235 A1 | 5/2002 | Dinnerstein |
| 2002/0061701 A1 | 5/2002 | Chan |
| 2002/0107075 A1 | 8/2002 | Stephan |
| 2002/0111203 A1 | 8/2002 | Chi |
| 2002/0155783 A1 | 10/2002 | Chan |
| 2002/0186302 A1 | 12/2002 | Pulkinnen |
| 2002/0196250 A1 | 12/2002 | Anderson et al. |
| 2003/0021455 A1 | 1/2003 | Dixon et al. |
| 2003/0148249 A1 | 8/2003 | Marcus et al. |
| 2003/0162160 A1 | 8/2003 | Horchler et al. |
| 2005/0003885 A1 | 1/2005 | Rhoten |
| 2005/0049023 A1 | 3/2005 | Foster |
| 2005/0075035 A1 | 4/2005 | Hatting et al. |
| 2005/0184459 A1 | 8/2005 | Marantz et al. |
| 2005/0234592 A1 | 10/2005 | McGee et al. |
| 2005/0243489 A1 | 11/2005 | Seymour |
| 2005/0245103 A1 | 11/2005 | Ellison |
| 2006/0041730 A1 | 2/2006 | Larson |
| 2006/0100739 A1 | 5/2006 | Raffle et al. |
| 2006/0136180 A1 | 6/2006 | Hansen et al. |
| 2007/0072442 A1 | 3/2007 | DiFonzo et al. |
| 2007/0173095 A1 | 7/2007 | Bin-Nun et al. |
| 2007/0184722 A1 | 8/2007 | Doherty |
| 2007/0256337 A1 | 11/2007 | Segan |
| 2007/0262984 A1 | 11/2007 | Pruss |
| 2007/0278740 A1 | 12/2007 | Mao |
| 2008/0083149 A1 | 4/2008 | Zebersky |
| 2008/0090485 A1 | 4/2008 | Glickman et al. |
| 2008/0166926 A1 | 7/2008 | Seymour et al. |
| 2008/0224396 A1 | 9/2008 | Cocis et al. |
| 2008/0232061 A1 | 9/2008 | Wang et al. |
| 2008/0259551 A1 | 10/2008 | Gavenda et al. |
| 2009/0034169 A1 | 2/2009 | Richardson et al. |
| 2009/0127785 A1 | 5/2009 | Kishon |
| 2009/0180243 A1 | 7/2009 | Lynch et al. |
| 2009/0189348 A1 | 7/2009 | Kucharski |
| 2009/0214051 A1 | 8/2009 | Lockett et al. |
| 2009/0297136 A1 | 12/2009 | Lin |
| 2009/0305602 A1 | 12/2009 | Gaute |
| 2010/0033127 A1 | 2/2010 | Griffin et al. |
| 2010/0087119 A1 | 4/2010 | Vicentelli |
| 2010/0151738 A1 | 6/2010 | Chou |
| 2010/0197148 A1 | 8/2010 | Rudisill et al. |
| 2010/0214747 A1 | 8/2010 | Jacobs et al. |
| 2010/0259001 A1 | 10/2010 | Muller et al. |
| 2010/0311300 A1 | 12/2010 | Hansen et al. |
| 2010/0330867 A1 | 12/2010 | Fogel et al. |
| 2011/0021107 A1 | 1/2011 | Nag |
| 2011/0031689 A1 | 2/2011 | Binder |
| 2011/0059652 A1 | 3/2011 | Hoyack et al. |
| 2011/0097996 A1 | 4/2011 | Kalanithi et al. |
| 2011/0127718 A1 | 6/2011 | Wescom et al. |
| 2011/0143629 A1 | 6/2011 | Seymour et al. |
| 2011/0151743 A1 | 6/2011 | Munch et al. |
| 2011/0215998 A1 | 9/2011 | Fitzgerald et al. |
| 2011/0217898 A1 | 9/2011 | Barber |
| 2011/0221129 A1 | 9/2011 | Sisson et al. |
| 2011/0256740 A1 | 10/2011 | Naito et al. |
| 2011/0263145 A1 | 10/2011 | Kim |
| 2011/0292618 A1 | 12/2011 | Naukkarinen et al. |
| 2011/0300772 A1 | 12/2011 | Risvig |
| 2012/0069502 A1 | 3/2012 | Lauder et al. |
| 2012/0122059 A1 | 5/2012 | Schweikardt et al. |
| 2012/0135613 A1 | 5/2012 | Chatterjee et al. |
| 2012/0169748 A1 | 7/2012 | Merrill et al. |
| 2012/0182739 A1 | 7/2012 | Leung et al. |

(56) References Cited

U.S. PATENT DOCUMENTS

| | | |
|---|---|---|
| 2012/0200034 A1 | 8/2012 | Braha et al. |
| 2012/0223479 A1 | 9/2012 | Pabon |
| 2012/0262301 A1 | 10/2012 | Davidson et al. |
| 2012/0270479 A1 | 10/2012 | Batty |
| 2013/0016483 A1 | 1/2013 | Chuang et al. |
| 2013/0050958 A1 | 2/2013 | Bdeir |
| 2013/0069305 A1 | 3/2013 | Lee et al. |
| 2013/0069444 A1 | 3/2013 | Waffenschmidt et al. |
| 2013/0079080 A1 | 3/2013 | Binder |
| 2013/0234390 A1 | 9/2013 | Pabon |
| 2013/0273752 A1 | 10/2013 | Rudisill et al. |
| 2013/0301224 A1 | 11/2013 | Chu |
| 2013/0343025 A1 | 12/2013 | Bdeir |
| 2014/0038466 A1 | 2/2014 | Karodi et al. |
| 2015/0137448 A1 | 5/2015 | Binder |
| 2015/0236444 A1 | 8/2015 | Bdeir |
| 2016/0192492 A1* | 6/2016 | Huang .................. H05K 1/144 |
| | | 361/803 |
| 2016/0249478 A1 | 8/2016 | Wang et al. |
| 2016/0344136 A1 | 11/2016 | Bdeir |
| 2017/0036132 A1 | 2/2017 | Yang et al. |
| 2017/0093106 A1 | 3/2017 | Hochman et al. |
| 2017/0196086 A1 | 7/2017 | Bdeir |
| 2017/0291116 A1 | 10/2017 | MacDonald et al. |
| 2018/0212358 A1* | 7/2018 | Bdeir ...................... H01R 11/30 |
| 2019/0190196 A1* | 6/2019 | Bdeir ...................... A63H 33/08 |
| 2019/0289716 A1* | 9/2019 | Bdeir ...................... H05K 1/18 |
| 2019/0296482 A1* | 9/2019 | Bdeir ...................... H01R 11/30 |

FOREIGN PATENT DOCUMENTS

| | | |
|---|---|---|
| CN | 3237906 | 5/2002 |
| CN | 2615787 Y | 5/2004 |
| CN | 101076386 A | 11/2007 |
| CN | 301097689 | 12/2009 |
| CN | 301216015 S | 5/2010 |
| CN | 101843980 A | 9/2010 |
| CN | 102025050 A | 4/2011 |
| CN | 301545488 S | 5/2011 |
| CN | 301742222 S | 11/2011 |
| CN | 102366677 A | 3/2012 |
| CN | 102371073 A | 3/2012 |
| CN | 102527060 A | 7/2012 |
| CN | 102544814 A | 7/2012 |
| CN | 105207018 A | 12/2015 |
| EP | 0135633 A1 | 4/1985 |
| EP | 0976430 A1 | 2/2000 |
| EP | 1180701 A1 | 2/2002 |
| EP | 1616607 A1 | 1/2006 |
| EP | 2163998 A1 | 3/2010 |
| FR | 2629731 A1 | 10/1989 |
| FR | 2709427 A1 | 3/1995 |
| GB | 1378207 A | 12/1974 |
| GB | 2188956 A | 10/1987 |
| GB | 2267041 A | 11/1993 |
| GB | 2360469 A | 9/2001 |
| GB | 2398257 A | 8/2004 |
| GB | 2465339 A | 5/2010 |
| JP | 49-044613 B1 | 11/1974 |
| JP | 62-060065 U | 4/1987 |
| JP | 62-129781 U | 8/1987 |
| JP | 02-216777 A | 8/1990 |
| JP | 2002-537081 A | 11/2002 |
| JP | 2007-507724 A | 3/2007 |
| JP | 2008-516705 A | 5/2008 |
| JP | 2009-165593 A | 7/2009 |
| JP | 2010-024187 A | 2/2010 |
| JP | 2011-014365 A | 1/2011 |
| JP | 2011-054341 A | 3/2011 |
| JP | 3173981 U | 3/2012 |
| KR | 30-2003-0036843 | 12/2004 |
| KR | 10-2011-0129651 A | 12/2011 |
| RU | 2395881 C1 | 7/2010 |
| TW | 201226032 A | 7/2012 |
| WO | 94/28348 A1 | 12/1994 |
| WO | 97/12349 A1 | 4/1997 |
| WO | 01/91867 A1 | 12/2001 |
| WO | 01/97937 A1 | 12/2001 |
| WO | 03/32698 A1 | 4/2003 |
| WO | 2006/042549 A1 | 4/2006 |
| WO | 2007/137577 A1 | 12/2007 |
| WO | 2011/007349 A1 | 1/2011 |
| WO | 2011/011084 A1 | 1/2011 |
| WO | 2011/016032 A2 | 2/2011 |
| WO | 2011/122396 A1 | 10/2011 |
| WO | 2012/023935 A1 | 2/2012 |
| WO | 2013/175269 A1 | 11/2013 |
| WO | 2014/032043 A1 | 2/2014 |

OTHER PUBLICATIONS

B&B Electronics, RS-422 and RS-485 Application Note, B&B Electronics Manufacturing Co., Ottawa, IL, USA, Revised Jun. 2006, 22 pages.

Bdeir, A. et al., "Electronics As Material: littleBits," Proceedings of the 3rd International Conference on Tangible and Embedded Interaction (CHI 2008), Apr. 5-10, 2008, 4 pages.

Bdeir, A. et al., "Electronics As Material: littleBits," Proceedings of the 5th International Conference on Tangible and Embedded Interaction (TEI '11), Jan. 22-26, 2011, 4 pages.

Bdeir, A., "Building blocks that blink, beep and teach," TED Talk (online), Retrieved from the Internet: <URL: http://www.ted.com/talks/ayah_bdeir_building_blocks_that_blink_beep_and_teach>, on Jan. 6, 2016, printed copy of 5 pages from webpage including 2 pages of video transcript.

Bdeir, A., "littleBits intro," [online], Retrieved from the Internet: <URL: https://vimeo.com/1384026>, [Retrieved on Dec. 28, 2015], printed copy of 3 pages from webpage and printed version of online video, 118 pages.

Bdeir, A., "littleBits," Jul. 31, 2008, [online], Retrieved from the Internet: <URL: https://web.archive.org/web/20090512175818/http://www.ayahbdeir.com/category/work/>, [Retrieved on Dec. 29, 2015], 10 pages.

Bowin Electronic Company, Hong Kong, Datasheet LS 1356 IC, LSI, "4 Digit Time with Colon Default," Version 1.2 (Oct. 24, 2003), 6 pages.

Bowin Electronic Company, Hong Kong, Datasheet UM3481, UM3481 Series, "UM3481A A Multi-Instrument Melody Generator," Rev.6-03, (2010), 4 pages.

Cisco Systems, Inc., Publication No. 1-58705-001-3, "Internetworking Technologies Handbook", Chapter 7: Ethernet Technologies, pp. 7-1 to 7-38, (Jun. 1999), 38 pages.

Decision Granting Ex Parte Reexamination for Control No. 90/013,673, mailed on Jan. 28, 2016, 15 pages.

Duff, D. G et al., "Evolution of PolyBot: A Modular reconfigurable Robot," (2002), 7 pages.

Electronic Snap Circuits® Deluxe Snap Rover®, Projects 1-63 Instruction Manual, Elenco Electronics, Inc., 2008, 48 pages.

Electronic Snap Circuits® RC Snap Rover®, Projects 1-23 Instruction Manual, Elenco Electronics, Inc., Rev-B, Revised 2008, 24 pages.

Electronic Snap Kits™ Electronics 202 Instruction Manual, Catalog #28-287, Rev-C, Revised 2008, 132 pages.

Epson Corporation, Datasheet PF226-04 Epson 7910 Series, "Multi-Melody IC," Seiko-Epson Corporation, Electronic Devices Marketing Division, (1998), 4 pages.

Evaluation Report for Chinese Patent Application No. 201330114691.4, mailed on Apr. 9, 2014, 10 pages.

Examination Report for New Zealand Application No. 704976, mailed on Jan. 9, 2017, 5 pages.

Examination Report No. 1 for Australian Application No. 20133055556, mailed on Aug. 25, 2017, 4 pages.

Examination Report No. 1 for Australian Application No. 2018203907, mailed on Apr. 11, 2019, 2 pages.

Extended European Search Report issued by the European Patent Office for Application No. 18184425.9, dated Mar. 18, 2019, 13 pages.

(56) References Cited

OTHER PUBLICATIONS

Final Office Action for Ex Parte Reexamination Application No. 90/013,673 of U.S. Pat. No. 9,019,718, dated Jul. 20, 2017, 25 pages.
Final Office Action for U.S. Appl. No. 14/607,439, mailed May 10, 2017, 18 pages.
First Examination Report issued by the Indian Patent Office for Application No. 1400-DELNP-2015, dated Feb. 26, 2019, 7 pages.
First Office Action for Chinese Application No. 201610730917.6, dated Jun. 4, 2018, 3 pages non-English and 5 pages English translation.
First Office Action for Chinese Application No. 201610740452.2, dated Jun. 4, 2018, 4 page non-English and 6 page English translation.
First Office Action issued by the Chinese Patent Office for Application No. 201610738594.5, dated Jun. 26, 2018, 8 pages non-English and 11 pages English translation.
Fok, Catalog Datasheet, "True Random No. Generation IC RPG100 / RPG100B," Fok Corporation, Sep. 2005, 4 pages.
Gilpin, K. et al., "Miehe: Modular Shape Formation by Self-Disassembly," The International Journal of Robotics Research, 27:3-4 (Mar. 2008), 7 pages.
Holtek Semiconductor Inc., Datasheet HT3834, "36 Melody Music Generator," Rev. 1.00, CMOS VLSI Integrated Circuit (IC), (Nov. 2, 2006), 16 pages.
Hynix Semiconductor, Inc., HMS30C7202 Highly Integrated MPU (ARM based 32-bit Microprocessor) Datasheet version 1.3, (2002), pp. vi and 9, <www.datasheetarchive.com/250--sound+module-datasheet.html>.
IBM Corporation, International Technical Support Organization Redbook Document No. SG24-4756-00, "Local Area Network Concepts and Products: LAN Operation Systems and Management," 1st Edition (May 1996), 216 pages.
IEEE Std. 802.3af™-2003, "Part 3: Carrier Sense Multiple Access with Collision Detection (CSMA/CD) Access Method and Physical Layer Specifications, Amendment: Data Terminal Equipment (DTE) Power via Media Dependent Interface (MDI)," (2003), 133 pages.
IEEE Std. 802.3at(Trademark)-2009, "Part 3: Carrier Sense Multiple Access with Collision Detection (CSMA/CD) Access Method and Physical Layer Specifications, Amendment 3: Data Terminal Equipment (DTE) Power via Media Dependent Interface (MDI) Enhancements," (2009), 141 pages.
Integrated Circuit Systems, Inc., Datasheet ICS9120-08 and ICS9120-09, "Frequency Generator for Multimedia Audio Synthesis," Integrated Circuit Systems, Inc., 9120-08 9120-09 Rev C 052297P, downloaded from the Internet in 2009 8 pages.
International Search and Written Opinion issued by the International Searching Authority for Aoolication No. PCT/US18/66186, dated Mar. 5, 2019.
International Search Report and Written Opinion for International Application No. PCT/IL2010/000559, dated Nov. 16, 2010, 12 pages.
International Search Report and Written Opinion for International Application No. PCT/IL2010/000627, mailed Feb. 24, 2011, 16 pages.
International Search Report and Written Opinion issued by the International SearchingAuthority for Application No. PCTUS/2018/066168, dated Feb. 26, 2019, 11 pages.
International Search Report and Written Opinion received for PCT Patent Application No. PCT/US2013/056599, mailed on Jan. 16, 2014, 12 pages.
Jantapremjit, P. et al., "Design of a Modular Self-Reconfigurable Robot," Proc. 2001 Australian Conference on Robotics and Automation, Sydney (Nov. 14-15, 2001), 6 pages.
Magnevation LLC, SpeakJet chip, "Natural Speech & Complex Sound Synthesizer," User's Manual Revision 1.0, Magnevation LLC, (Jul. 27, 2004), 17 pages.
Maxim, Datasheet "General Purpose Timers," ICM7555/7556, Publication No. 19-0481, Rev. 2, Maxim Integrated Products (Nov. 1992), 8 pages.
Maxim, Datasheet MAX202E-MAX213E, MAX232E-MAX241-E, "±15kV ESD-Protected, 5V RS-232 Transceivers," Maxim Integrated Products, Inc. Sunnyvale, CA, USA, 19-0175; Rev 7; (Jan. 2015), 25 pages.
Maxim, Datasheet MAX3030E-MAX3033E, "±15kV ESD-Protected, 3.3V Quad RS-422 Transmitters," Maxim Integrated Products, Inc., Sunnyvale, CA, USA, 19-2671; Rev O; (Oct. 2002), 15 pages.
Maxim, Datasheet MAX3080-MAX3089 "Fail-Safe, High-Speed (10Mbps), Slew-Rate-Limited RS-485/RS-422 Transceivers," Maxim Integrated Products, Inc., Sunnyvale, CA. USA, 19-1138; Rev 3; (Dec. 2005), 20 pages.
Maxim, Datasheet MAX3095-MAX3096, "±15kV ESD-Protected, 10Mbps, 3V/5V, Quad RS-422/RS-485 Receivers," Maxim Integrated Products, Inc., Sunnyvale, CA, USA, 19-0498; Rev 1; (Oct. 2000), 13 pages.
Mendelson, G., White Paper, "All You Need To Know About Power Over Ethernet (PoE) and the IEEE 802.3af Standard," PowerDsine Ltd., 06-0002-082 (May 20, 2004), 24 pages.
National Semiconductor, Application Note 1031, "TIA/EIA-422-B Overview," National Semiconductor Corporation AN012598, (Jan. 2000), 7 pages.
National Semiconductor, Application Note 1057, "Ten Ways to Bulletproof RS-485 Interfaces," National Semiconductor Corporation AN012882, (Oct. 1996), 10 pages.
Non-Final Office Action issued by the United States Patent and Trademark Office for U.S. Appl. No. 15/822,636, dated May 25, 2018, 11 pages.
Non-Final Office Action issued by The United States Patent and Trademark Office for U.S. Appl. No. 15/845,730, dated Mar. 25, 2019, 11 pages.
Office Action for Chinese Application No. 201380004224.3, mailed Jan. 20, 2016, 12 pages.
Office Action for Chinese Patent Application No. 201380004224.3, issued on Jun. 2, 2015, 14 pages.
Office Action for European Application No. 13831481.0, mailed on Apr. 10, 2017, 4 pages.
Office Action for Ex Parte Reexamination Application No. 90/013,673 of U.S. Pat. No. 9,019,718, mailed on Apr. 15, 2016, 19 pages.
Office Action for Japanese Application No. 2015-528712, dated Apr. 16, 2018, 6 pages non-English and 7 pages English translation.
Office Action for Japanese Application No. 2015-528712, mailed on Jun. 16, 2017, 20 pages.
Office Action for Russian Application No. 2015110259/12(016148), dated Aug. 2, 2017 (12 pages non-English, 10 pages English translation, and 2 pages English translation of Search Report).
Office Action for Russian Application No. 2015110259/12(016148), dated Feb. 22, 2018 (6 page non-English, 6 page English translation).
Office Action for U.S. Appl. No. 12/568,834, mailed Aug. 7, 2012, 26 pages.
Office Action for U.S. Appl. No. 12/568,834, mailed Mar. 13, 2013, 37 pages.
Office Action for U.S. Appl. No. 13/668,693, mailed Apr. 2, 2014, 20 pages.
Office Action for U.S. Appl. No. 14/696,922, mailed Jun. 29, 2015, 12 pages.
Office Action for U.S. Appl. No. 15/228,707, mailed on Apr. 24, 2017, 9 pages.
Office Action for U.S. Appl. No. 13/975,923, mailed Mar. 10, 2016, 24 pages.
Office Action for U.S. Appl. No. 14/607,439, mailed Dec. 15, 2017, 19 pages.
Office Action for U.S. Appl. No. 14/607,439, mailed Oct. 5, 2016, 16 pages.
Office Action issued by the Canadian Patent Office for Application No. 2,883,216, datedMay 16, 2019, 4 pages.
Office Action issued by the Japanese Patent Office for Application No. 2015-528712, dated Apr. 1, 2019, 7 pages including English translation.
Office Action issued by the Mexican Patent Office for Application No. MX/a/2015/002306, dated Oct. 11, 2017, 5 pages.

(56) References Cited

OTHER PUBLICATIONS

Office Action issued by the New Zealand Intellectual Property Office for Application No. 704976, dated Oct. 27, 2017, 5 pages.
Office Action received for U.S. Appl. No. 13/593,891, mailed on Oct. 20, 2014.
Oki Electric Industry Co., Ltd., Datasheet ML2215 FEDL2215-01, Oki Semiconductor, "Speech synthesizer plus Music LSI with On-Chip 3 Mbit Mask ROM," (May 2001), 26 pages.
OPTi, Data Book, "82C931 Plug and Play Integrated Audio Controller," OPTi Inc., Milpitas, CA, USA, Doc. 912-3000-035 Revision 2.1 (Aug. 1, 1997), 64 pages.
Philips, Application Note, Integrated Circuits, "AN170-NE555 and NE556 Applications," Philips Semiconductors, (Dec. 1988), 19 pages.
RadioShack Electronics 202 Snap-Kit [online from Dec. 15, 2006] Retrieved from the internet at https://web.archive.org/web/20070706062800/http://www.radioshack.com/family/index.jsp?categoryId=2032405&cp=2032062.2032398, 6 pages.
RadioShack Electronics 202 Snap-Kit [online from Jan. 16, 2008] Retrieved from the internet at https://web.archive.org/web/20100607064759/http://www.radioshack.com/family/index.jsp?s-null&categoryId=2032398&pg=2&s=null.
RadioShack Electronics 202 Snap-Kit [online from Jul. 6, 2007] Retrieved from the internet at https://web.archive.org/web/20080116182315/http://www.radioshack.com/product/index.jsp?productId=2102915&cp=2032062.2032398&parentPage=family.
RadioShack Electronics 202 Snap-Kit [online from Jun. 7, 2010], Retrieved from the internet at https://web.archive.org/web/20061215105908/http://www.radioshack.com/family/index.jsp?categoryID=2032405 &cp=2032062.2032398.
Request for Ex Parte Reexamination of U.S. Pat. No. 9,019,718, Control No. 90/013,673, filed Jan. 6, 2016, 45 pages.
Schwei Kardt, E. et al., "Learning about Complexity with Modular Robots," Second IEEE International Conference, Piscataway, NJ, USA, (Nov. 17, 2008), 8 pages.
Schwei Kardt, E. et al., "roBlocks: A Robotic Construction Kit for Mathematics and Science Education," ICMI '06, Nov. 2-4, Banff, Alberta, Canada (2006), 4 pages.
Schwei Kardt, E. et al., "The Robot is the Program: Interacting with roBlocks," (2008), 2 pages.
Schweikardt, E. et al., "A Brief Survey of Distributed Computational Toys," The First IEEE International Workshop ON, IEEE, PI (Mar. 1, 2007), 8 pages.
Search Report for European Application No. 13831481.0, mailed Feb. 22, 2016, 9 pages.
Second Office Action for Chinese Application No. 201610730917.6, dated Jan. 21, 2019, 6 Pages and 4 pages English translation.
Second Office Action for Chinese Application No. 201610740452.2, dated Jan. 21, 2019, 6 Pages (Non-English).
Second Office Action issued by the Chinese Patent Office for Application No. 201610738594.5, dated Feb. 22, 2019, 7 pages including English translation.
Stoy, K. et al. (eds.), "Modular Robotics: The State of the Art," Proceedings of the IEEE 2010 International Conference on Robotics and Automation Workshop, (May 3, 2010), 121 pages.
Supplementary Examination Written Opinion for Singapore Application No. 11201501308P, mailed on May 18, 2017, 4 pages.
Teccor Electronics, "SIDACtor Data Book and Design Guide," Irving, Texas, USA (2002), 213 pages.
Universal Serial Bus Specifications, Revision 1.0, NTGR-SERC 012327-012594, (Jan. 15, 1996), 268 pages.
Yamaha, YMF721 Catalog No. LSI-4MF721A20, "YMF721 OPL4-ML2 FM+Wavetable Synthesizer LSI," Yamaha Corporation, Shizuoka, Japan (Jul. 10, 1997), 41 pages.
Yim et al., Modular Self-Reconfigurable Robot Systems, IEEE Robotics & Automation Magazine, downloaded on Apr. 16, 2010 at 21:26:38 UTC from IEEE Xplore, 10 pages.
Yim, M. et al., "Modular Self-Reconfigurable Robots," Encyclopedia of Complexity and Systems Science, pp. 19-32 (2009).

\* cited by examiner

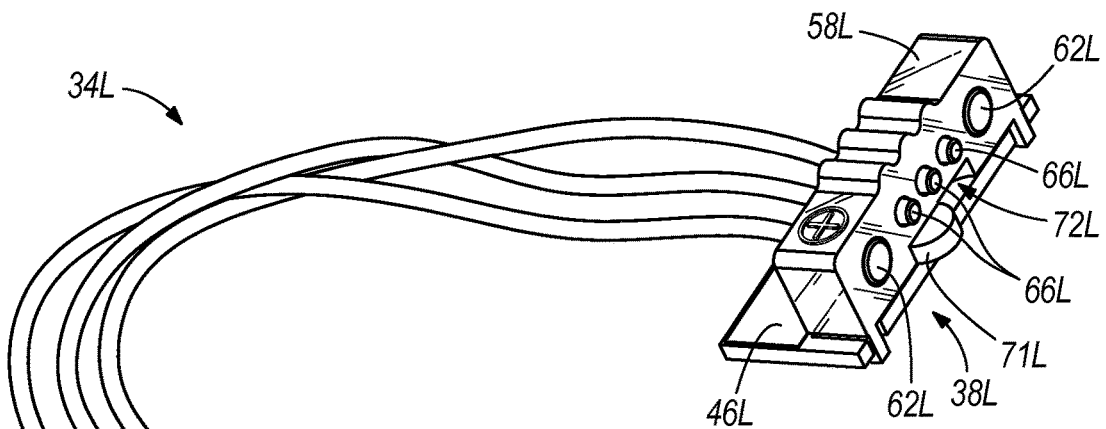
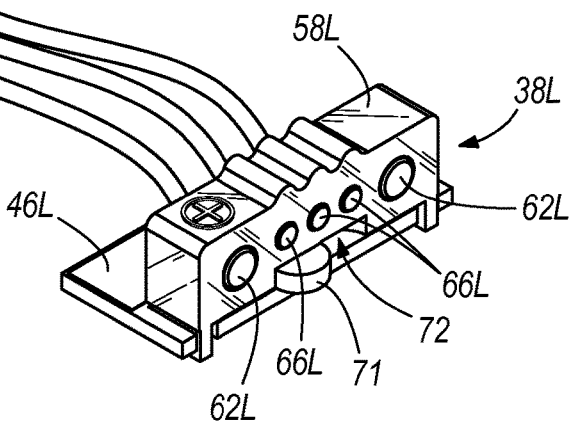
FIG. 11
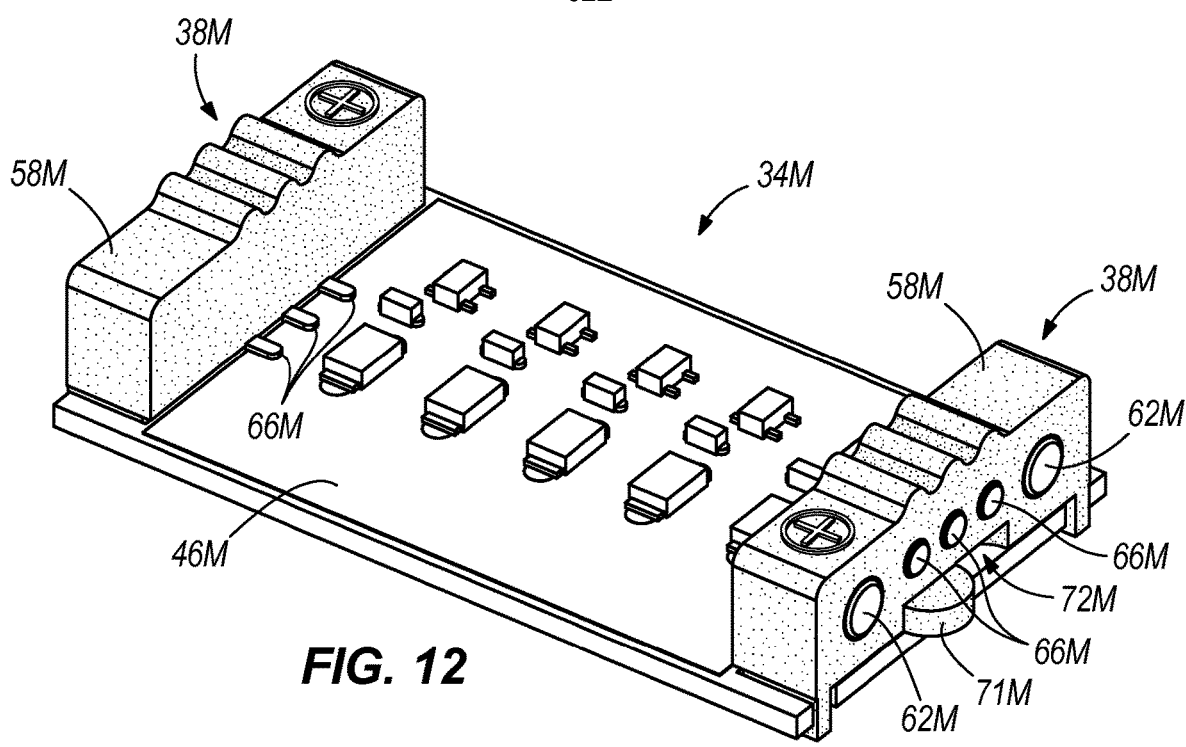
FIG. 12

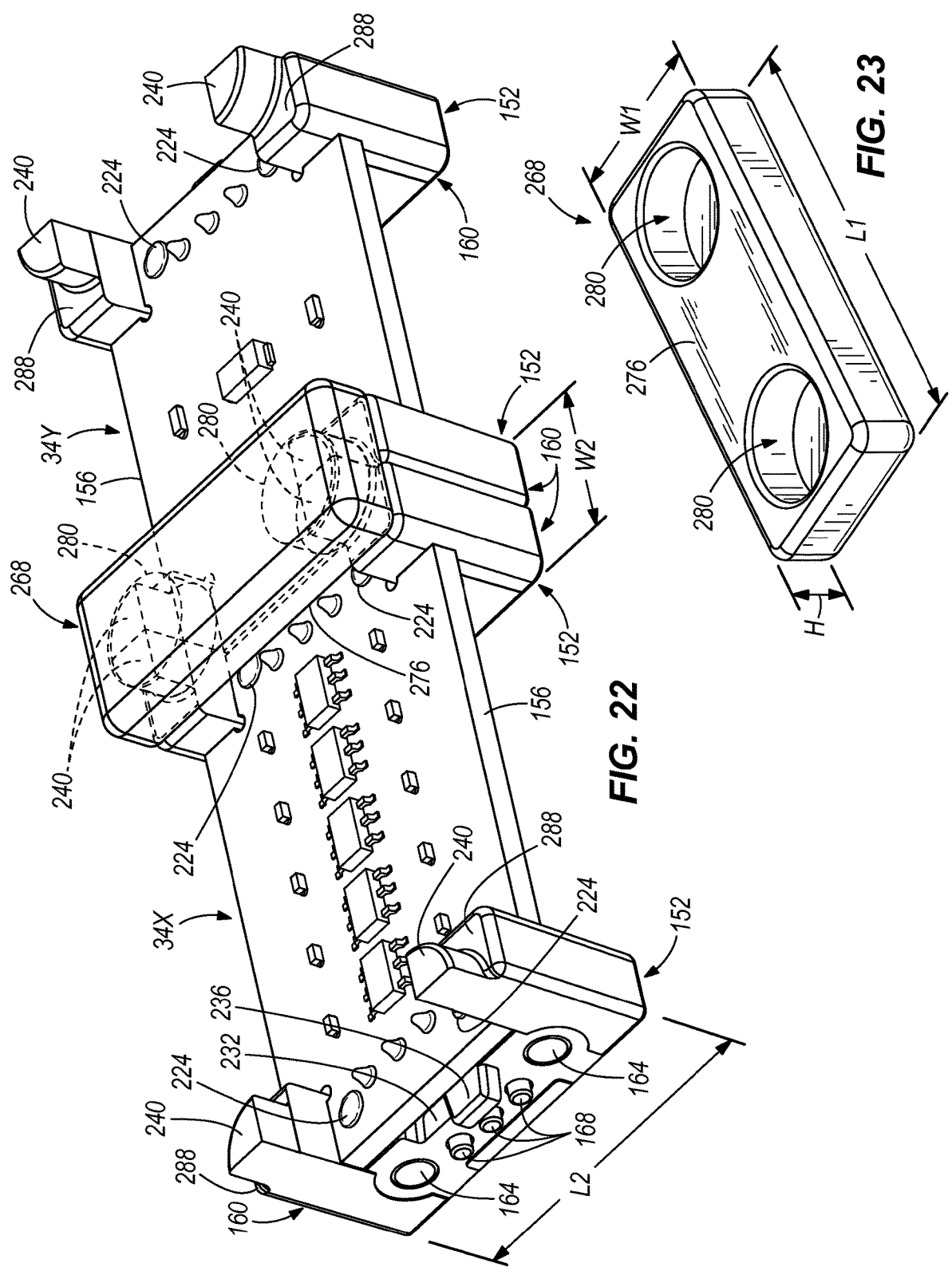

MODULAR ELECTRONIC BUILDING SYSTEMS WITH MAGNETIC INTERCONNECTIONS AND METHODS OF USING THE SAME

RELATED APPLICATIONS

This application is a continuation of U.S. patent application Ser. No. 15/463,510, entitled "Modular Electronic Building Systems with Magnetic Interconnections and Methods of Using the Same," filed Mar. 20, 2017, which is a continuation of U.S. patent application Ser. No. 13/975,923, entitled "Modular Electronic Building Systems with Magnetic Interconnections and Methods of Using the Same," filed Aug. 26, 2013, now U.S. Pat. No. 9,597,607, which claims priority to and the benefit of U.S. Provisional Patent Application No. 61/728,103, entitled "Modular Electronic Building Systems with Magnetic Interconnections and Methods of Using the Same," filed Nov. 19, 2012, and which is a continuation-in-part of U.S. patent application Ser. No. 13/593,891, now U.S. Pat. No. 9,019,718, entitled "Modular Electronic Building Systems with Magnetic Interconnections and Methods of Using the Same," filed Aug. 24, 2012, which claims priority to U.S. Provisional Patent Application No. 61/527,860, filed Aug. 26, 2011, each of the disclosures of which is incorporated herein by reference in its entirety.

FIELD OF THE INVENTION

The present invention relates to the field of electronics and, more particularly, to electronic building blocks and toy building sets.

BACKGROUND

Currently, people spend many hours a day with technological devices, but most don't know how they work, or how to make their own. For all the interactivity of these devices, people are bound to passive consumption. Furthermore, playing, creating, or integrating electronics into projects, toys and products is intimidating, time consuming, requires an expert skill set, as well as specialized hardware/software platforms. People are afraid to connect electronic objects the wrong way, or to electrocute themselves. This makes building objects with lights, sounds, buttons and other electronic components very difficult and prohibitive to kids, young students, designers, non-engineers, and others lacking necessary experience. But as advances in the miniaturization of technology increase, electronics need to become more accessible to non-experts in a cost effective manner.

It becomes therefore clear that there is an opportunity and need to create a simple, easy to use, accessible electronic building block platform that can still enable the creation of complex, interdependent systems. Such a platform would enhance learning, enable 21st century experimentation and promote innovation. Also, what is needed is a system that acts like an additional material in the creative process and allows children and adults to combine and incorporate the system or its parts with other traditional materials such as paper, cardboard and screws.

The following references provide background information and are hereby incorporated by reference in their entirety: Ayah Bdeir, (2009), Electronics as material: littleBits, *In Proceedings of the 3rd International Conference on Tangible and Embedded Interaction* (TEI '09), ACM, New York, NY, USA, 397-400, DOI=10.1145/1517664.1517743, at http://doi.acm.org/10.1145/1517664.1517743; and Ayah Bdeir and Ted Ullrich, (2010), Electronics as material: littleBits, *In Proceedings of the fifth international conference on Tangible, embedded, and embodied interaction* (TEI '11), ACM, New York, NY, USA, 341-344, DOI=10.1145/1935701.1935781, at http://doi.acm.org/10.1145/1935701.1935781.

SUMMARY

In some exemplary aspects, an electronic educational toy or building system is provided that teaches the logic of programming and circuit building without requiring expertise in either. The modular block building system consists of pre-assembled printed circuit boards (PCB) interconnected by small magnets. Each block performs one or more discrete functions (e.g., an LED, a pushbutton, a light sensor with a threshold, etc.), and the blocks can be combined to create larger circuits. Some blocks respond to external events such as mechanical forces, touch, proximity, radio frequency signals, environmental conditions, etc. Other blocks are pre-programmed such as synthesizers, oscillators, etc. Still other blocks simply pass current like wire blocks. Yet other blocks provide current such as power blocks/modules.

In some aspects, the system includes modules having many different manners of interaction between the modules. The interaction between modules, not the modules themselves, may form the building blocks of the creative platform. In previous electronic kits the electronic component may be at the center of the manipulation: resistors, capacitors, batteries, etc. By manipulating the modules in those kits, children learn how electricity flows, how to design a circuit, or how to identify components. This knowledge, however, is application specific and features only a single circuit. It has little or no bearing on how the touch sensitive wheel of an iPod™ works, for example, or how a nightlight works, or how a cell phone vibrates, or how a phone can detect rotation and automatically rotate images on the screen in response to that rotation, or how to make one's own objects that have that interactivity. While we are a society obsessed with increasingly complex electronic devices (such as, for example, DVD players, MP3 players, cell phones, smoke alarms), the current learning tools on the market only teach the very basics of electronics and electricity, such as allowing us to turn on a light or see current flow. There is a widening gap between what is taught to the average American and what is both used and consumed by that American. This is also why most electronic kits and toys are very short-lived in that the kits and toys are not relevant to user's day-to-day life. To date, there is no way for children or adults to be able to create their own interactive objects with custom-designed interactive behavior, without having to program or learn the many complexities involved with advanced electronics. With the present modular system, people will be able to program interactivity intuitively and in a tangible way.

The description and drawings herein are meant as an illustration of one or more exemplary embodiments of the invention, but should not be considered limiting or restrictive. As such, there are a number of manners of modification without departing from the spirit and scope of the invention. In the following text, the words block and module may be used interchangeably to signify the modular circuit boards.

The modules may be divided into categories corresponding to their function. Examples of categories include, but are not limited to: power modules, input modules, output modules, wire modules, etc. Power modules for instance take current from a battery, a wall wart, or other power source, and convert it into current feeding the other components of the system. In any working configuration of modules, there may be at least one power module. Input modules include, but are not limited to: buttons, switches, sensors, logic blocks, etc. Output modules include, but are not limited to: LEDs, displays, sound modules, etc. Wire modules do not perform a particular function, but act as wire extensions, configuration changers, and in some cases logic and state modules.

In one exemplary embodiment, standalone blocks are provided that may enable users, with little or no electronics or programming experience, to construct basic and complex sensor and interaction-based analog and digital circuits.

In another exemplary embodiment, the general electrical operation of the system is as follows. All modules may include a standard interface and communicate automatically when connected. Each module includes three electrical lines and such lines are interconnected between and throughout all modules. These lines include Power, Signal and Ground. At the power modules, Power and Signal lines are at 5 Volts, the system is low power, and the Power and Ground lines are shared among all the modules. In other exemplary embodiments, the power may be something other than 5 Volts such as, for example, 3V, 9V, 12V, 15V, alternating current (AC), etc. Input modules take the incoming control Signal line, and manipulate it according to the module's function, and output the modified Signal voltage. In the case of a pressure sensor connected to a power module, for instance, the sensor module takes 5 Volts into the Signal line, and outputs a voltage between 0 and 5 Volts depending on the amount of pressure applied to the sensor. Output modules respond to the Signal line by "visualizing" the voltage in light, sound, display or other forms.

All modules are pre-assembled, pre-engineered, and contain the logic and circuitry required to make the component readily usable. For instance, an LED module contains a resistor corresponding to its current rating, an Operation Amplifier (OpAmp) as a buffer from the remainder of the circuit, and a coin cell battery module incorporates a discharge protection circuit. In some exemplary embodiments, the system requires no prior knowledge of electronics and does not require any hardware or software platform. In other exemplary embodiments, the system may include a hardware and/or software platform. Also, in some exemplary embodiments, since the modules do not need to be programmed and do not require a central circuit controlling them, the system is standalone and does not need a computer or hub. However, according to one exemplary embodiment, the system may be connected to a device such as a computer, hub, memory storage, or personal electronic mobile device such as a cellular phone, smart phone, etc., in order to create additional functionality or to retrieve information or power from the device.

In some aspects, the modules are designed to couple together and cascade one after the next. The modules include magnetic connectors that ensure electrical connectivity and may be developed and mounted on the PCB. The magnetic connectors may be in male form and female form, and in some examples may correspond to north and south faces of magnets. For standard blocks, each block may have two magnetic connectors mounted on it, one with the north face of the magnet(s) facing out and the other with the south face of the magnet(s) facing out. The south facing side of the magnetic connector of one module connects to the north facing side of the magnetic connector on the next module. This ensures proper connection and appropriate polarity. The repelling polarities inhibit the magnets from connecting in an inappropriate manner to facilitate connecting of the modules in the correct manner.

In another exemplary embodiment, the magnetic connector includes two magnets and three conductors embedded in an injection molded plastic body. The two magnets act as polarizing and locking elements, whereas the conductors carry the signal from one circuit board to the next through the mating of the male and female connectors. In the male version of the connector, the three conductors are spring probes. On the female version of the connector, the conductors may either be spring probes or small metal plates. Either way, the spring probes or the metal plates come into contact with the spring probes of the male connector and transfer the electrical signals into the circuit board. The magnetic connector also features an interlocking system as part of the plastic casing in the form of male and female complementary components. In one example, a male protrusion is included on one block and a female indentation is included on a second block. The protrusion and indentation cooperate to inhibit the blocks from sliding with respect to each other. In another example, a male protrusion and a female indentation are included on each block and the male protrusions and the female indentations on interfacing blocks cooperate to inhibit the blocks from sliding with respect to each other.

According to one exemplary embodiment, the magnetic connector also features an interlocking system as part of the plastic casing in order to inhibit the modules from sliding side-to-side with respect to each other, and to ensure that the modules are assembled in the correct orientation (i.e., to inhibit an upside-down connection). To inhibit side-to-side movement, the connectors can include a protrusion on the male or female side that corresponds to an indentation on the corresponding female or male side. Once the modules are connected, the protrusion enters the indentation and the modules are sufficiently locked together such that side-to-side movement is inhibited. In another embodiment, the connectors can include a tabbed feature to inhibit side-to-side movement. For example, as shown in FIG. 12, the portion of the connector nearest the circuit board (the "base") includes both a rounded tab that protrudes laterally from the connector and a rounded indentation adjacent to the tab. A corresponding connector will include a rounded tab and indent in a configuration such that when the two connectors are adjoined, the rounded tab of the first connector inserts into the rounded protrusion of the second connector, and the rounded tab of the second connector inserts into the rounded protrusion of the first connector, thereby locking the two connectors together such that side-to-side movement is prevented. To prevent upside-down connections, the connectors can include one or more protrusions. For example, as shown in FIG. 12, the portion of the connector furthest from the circuit board (the "top") includes a series of horizontal protrusions. When two modules are adjoined by the user, the horizontal protrusions on the two modules will properly align. Further, due to the rounded tab at the bottom of the connector, as shown in FIG. 12 for example, if a second connector was adjoined upside-down, the horizontal protrusions of the second connector would hit the rounded tab of the first connector and prevent the two connectors from properly adjoining.

In addition to the previously described exemplary connectors, many modifications to the connectors are possible, including, but not limited to, the casing, the type of conductors used, the number of conductors, as well as whether or not the magnets are acting as conductors, the number of magnets, the shape of the magnets, the polarity of the magnets, the manner in which the connectors couple to the circuit board of the block, etc.

In order for the system to be expressive and broaden, rather than constrain creativity, the number of available modules needs to be plenty. In general, only having a few nuts and bolts in the prototyping process is not very helpful, and alternatively can even be prohibitive. The present invention allows for the addition of new modules according to the interconnection and voltage standards. For example, starting from a set of a hundred modules, we can imagine and design hundreds or thousands of additional modules that fit and cooperate with the present system to extend the system's functionality. For example, we can potentially build modules such as galvanic skin sensors, arsenic detectors, microcontroller modules, etc., as well as adapter boards to other electronic block building systems and interfaces.

At least one exemplary embodiment has been designed to allow for complex behaviors programmed through physical interaction. The set features logic and state modules that introduce the concept of programming to novices. Examples of such modules are the AND, OR and NOT blocks, as well as the Threshold block. These enable the user to program certain behaviors of his/her designed system without needing to learn a programming language, to write code on a computer, or to program a microcontroller circuit. Programming here is done through using logic modules to create decision trees. Also, modules feature controls such as switches, knobs and buttons that enable selection of modes of behavior. Just like a blender can have three buttons, each button corresponding to a particular speed of its motor, some modules in the present invention allow for the selection of a mode or adjustment of their behavior. For instance, a proximity sensor block can contain a mode switch and a potentiometer. Through the manipulation of the embedded potentiometer, the threshold level can be set, determining the input voltage level beyond which the module should output a high. Also, by flipping the switch, the module can go from normally-high to normally-low, in essence inverting its response to the desired threshold.

All blocks may be designed with space constraints in mind and may be kept at the minimum size possible in order to make the blocks easily integrable with other materials such as, for example, cardboard, plastic, pipe cleaners, etc. The blocks are user friendly in their look as well as their size, and make playing and prototyping with them attractive to children and adults alike regardless of the goal.

The modules may be offered as individual blocks or as sets. These can range from standard block components to specialized sets such as sensor sets, mechanical sets, biological sets, sound sets, etc. Also, users can design and build their own modules or sets to extend the library.

In some aspects, an electrical connector is provided and includes a housing defining a side surface, an electrical conductor supported by the housing and including an engagement portion proximate the side surface of the housing, wherein the engagement portion is adapted to engage another electrical conductor of another electrical connector, a magnet supported by the housing proximate the side surface of the housing, a projection extending from the side surface of the housing, and a receptacle defined in the side surface of the housing.

In other aspects, an electrical module is provided and includes a circuit board and an electrical connector. The electrical connector includes a housing defining a side surface, an electrical conductor supported by the housing and including a coupling portion and an engagement portion, wherein the coupling portion is adapted to engage and electrically communicate with the circuit board, and wherein the engagement portion is proximate the side surface of the housing, a magnet supported by the housing proximate the side surface of the housing, a projection extending from the side surface of the housing, and a receptacle defined in the side surface of the housing.

In further aspects, a system is provided and includes a plurality of electrical modules selectively couplable together to transmit electrical current from one electrical module to another electrical module, each module has at least one functionality associated therewith and includes an electrical connector adapted to couple to an electrical connector of another one of the electrical modules, wherein, with the electrical connectors coupled together, a functionality of at least one of the plurality of electrical modules is dependent upon at least another one of the plurality of electrical modules.

In still other aspects, a system is provided and includes a plurality of electrical modules adapted to be selectively coupled to one another, wherein the plurality of electrical modules include at least a first electrical module and a second electrical module, the first electrical module including a first circuit board, and a first electrical connector including a first housing, a first electrical conductor supported by the first housing and including a first coupling portion and a first engagement portion, wherein the first coupling portion is adapted to engage and electrically communicate with the first circuit board, a first magnet supported by the first housing, a first projection extending from the first housing, and a first receptacle defined in the first housing. The second electrical module includes a second circuit board, and a second electrical connector including a second housing, a second electrical conductor supported by the second housing and including a second coupling portion and a second engagement portion, wherein the second coupling portion is adapted to engage and electrically communicate with the second circuit board, a second magnet supported by the second housing, a second projection extending from the second housing, and a second receptacle defined in the second housing, wherein, with the first electrical module coupled to the second electrical module, the first magnet is magnetically coupled to the second magnet, the first engagement portion engages the second engagement portion, the first projection is at least partially positioned within the second receptacle, and the second projection is at least partially positioned within the first receptacle.

The present invention is capable of various modifications and alternative constructions, some of which are detailed in the drawings below. However, it should be clear that the intention is not to limit the invention to a particular embodiment or form, but rather the present invention should cover changes, additions and modifications as part of its scope. Independent features and independent advantages of the present invention will become apparent to those skilled in the art upon review of the detailed description and drawings.

BRIEF DESCRIPTION OF THE DRAWINGS

FIG. 11 is a perspective view of an exemplary wire module of the system;

FIG. 12 is a top perspective view of an exemplary output module of the system;

FIG. 22 is a bottom perspective view of two exemplary modules coupled together and an exemplary support member coupled to two of the connectors;

FIG. 23 is a top perspective view of the support member shown in FIG. 22;

Figure 1:
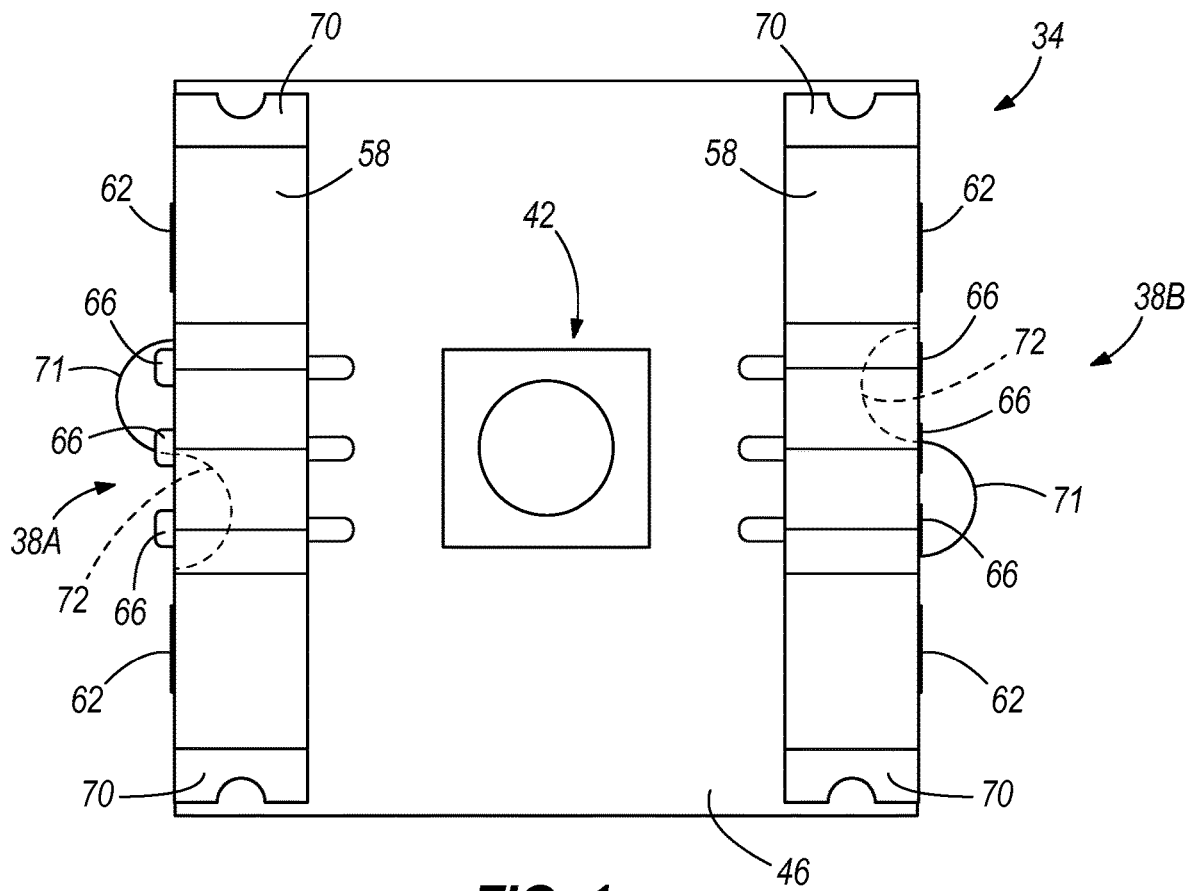
FIG. 1 is a top view of an exemplary module of the system.

Before any independent features and embodiments of the invention are explained in detail, it is to be understood that the invention is not limited in its application to the details of the construction and the arrangement of the components set forth in the following description or illustrated in the drawings. The invention is capable of other embodiments and of being practiced or of being carried out in various ways. Also, it is understood that the phraseology and terminology used herein is for the purpose of description and should not be regarded as limiting. For example, directional terms such as "top", "bottom", "above", "below", "front", "back", etc. are not intended to be limiting and are used for describing the exemplary illustrated embodiments herein.

DETAILED DESCRIPTION

An exemplary electronic building system 30 is provided. The electronic building system 30 is not only meant for use with pre-designed components and modules 34, but can also allow users to combine those modules 34 with other traditional prototyping and playing items in a design studio or home. Such materials may include, for example, paper, cardboard, wood, glue, pipe cleaners, foam, etc., thereby encouraging individuals to treat electronics like a material in the creative process.

In some exemplary embodiments, the system 30 may include at least four different types of modules 34: power; input; output; and wire; although more types of modules 34 are possible. Power modules 34 provide electricity to the system 30. Input modules 34 interpret data or their surroundings and provide that input to the system 30. Output modules 34 make visual, physical, or audible changes to their surroundings based on input(s) to the system 30. Wire modules 34 route power and communication between the modules 34 in the system 30.

According to one exemplary embodiment, when a first module 34 is connected to a second module 34, the power signal is transferred from the first module 34 to the second module 34. Accordingly, the second module 34 is powered entirely by the first module 34. If a button module 34, sensor module 34, or other module 34 is placed somewhere between a first module 34 and a second module 34, the current may be affected by the action of the button module 34 or sensor module 34. For example, current may not pass (or, alternatively, may continuously pass) from the first module 34 to the second module 34 unless the button on the button module 34 is depressed or the sensor on the sensor module 34 is activated. Similarly, if a sensor module 34 is only partially activated, then only partial current is transferred from the first module 34 to the second module 34.

Many different types of modules 34 are possible in each category, including but not limited to the following: (i) power modules: wall power modules, battery power modules, solar power modules, discharge protection circuits; (ii) input modules: pulse modules, pressure sensor modules, proximity modules, input recording modules, potentiometer modules, button modules, temperature modules, accelerometer modules, memory modules, timer modules; (iii) output modules: motion modules, vibration motor modules, fan modules, RGB LED modules, LED modules, bar graph modules, speaker modules; and (iv) wire modules: wire modules of various lengths, extender modules, splitter modules, and electroluminescent wire modules. Any known type of circuit or electronic component or combination of components may be used to create a module 34 and thus form a portion of a system 30 built using such components.

The modular system 30 described herein is reusable, scalable from small and simple circuits to large and complex circuits, and are sophisticated enough to allow for complex programming of behavior through manipulating tangible objects (using logic and state modules 34). Additionally, just as programmers use software modules and libraries to create bigger and more complex software programs, the modules 34 are transformed into a library of electronic components that can be used to create bigger and more complex components or systems. Indeed, a user can expand the module library almost indefinitely, adding any new component that they wish to use to their module repository.

Users can even create their own modules 34 and add them to the rest of the library. For example, according to one exemplary embodiment, users may be provided with components of a module 34—such as male magnetic connectors 38A and female magnetic connectors 38B that are able to snap onto or otherwise couple to a small circuit board, sensor, or other electronic component such that the connectors 38A/38B transmit current from one module 34 to another—that they can use to create their own inter-connectable modules 34 built from circuit board, sensors, or output mechanisms that they have built or gathered from another source.

According to another exemplary embodiment, a system 30 comprising several modules 34 may be commercialized as a single kit or set. The kit may include one or more different modules 34 (power, input, output, and/or wire), may comprise one or more different types of each module 34, a container in which to store the modules 34, a mounting board or substrate upon which to place or couple modules, may include learning materials, accessories, instructions, or a variety of other components. For example, a kit may comprise a handful of modules 34 that may be connected in an almost unlimited number of combinations to perform numerous different input and output functions (see FIGS. 10 and 17). In other exemplary embodiments, the kit may also comprise a limited number of modules 34 that are intended to be assembled in a limited number of combinations, including a single combination, to perform a limited number of functions. For example, to comprise a kit that is intended to be built into a functional system, the kit can comprise as many as tens or hundreds or more modules 34, or it can comprise just two modules 34 (a power module and an output module). Alternatively, the kit may be intended to augment an existing module library, in which case it may comprise just one type of module 34, such as a kit of only wire modules 34 or only output modules 34, for example. The kits may also be directed to a certain age group, with a kit for the elementary level comprising fewer and/or less complicated modules 34 than a kit designed for the high school level, for example. In one exemplary embodiment, the kits may include instructions, videos, or other means which inform the user as to one or more possible combinations of the modules 34. For example, the instructions may instruct the user how to assemble the modules 34 into a battery-powered motion sensor that emits an audible alarm upon detection of movement.

One potential aspect of the exemplary kits, systems, and modules may be to extend the concept of the modular platform into more complex components. According to one exemplary embodiment, the system 30 is adapted to give access to sophisticated devices through, for example, simple three-line analog interfaces. Exemplary complex devices may include, but are not limited to, LCD displays, OLED screens, timers, accelerometers, logic gates, and many more. This may be accomplished by pre-engineering all modules 34 and providing "entry points" into the devices. The entry points are, for example, knobs or switches that allow the user to adjust the intensity or frequency of pulsing, flip modes of operation, set thresholds, make decisions, or remember a configuration, among many other operations. These may be considered "entry points" because they are based on similar devices that people know how to use from their everyday lives. The exemplary modular systems described herein may take lessons and iconography from consumer electronics (such as, for example, blenders, DVD players, alarm clocks, game consoles) and apply them to these semi-raw electronic modules 34. In this way, the modular system 30 may treat electronic components like they are electronic devices. This means the learning curve for using and creating with the modular system 30 is very low, and the user's pre-existing knowledge obtained from manipulating their own consumer electronics may be taken advantage of to allow the users to program new objects through interaction.

An exemplary entry point may include an OLED screen module 34 which requires an SD card slot in which users can insert an SD card preloaded with images and video. The OLED screen module 34 may also include a microcontroller on-board which is pre-programmed with firmware to access and display the images. Also integrated in the OLED screen module 34 may be a toggle switch and a knob, where the toggle switch selects between fixed images/video or looping and the knob adjusts the looping speed. In the above example, even though the circuit-board and firmware itself may be complex, the end result will be an easy-to-use OLED screen module 34 with appropriate iconography that may be accessible to children and novice users alike. The exemplary system 30 may allow for and include the pre-engineering and design of numerous other complex modules 34 similar to the OLED screen example.

Figure 2:
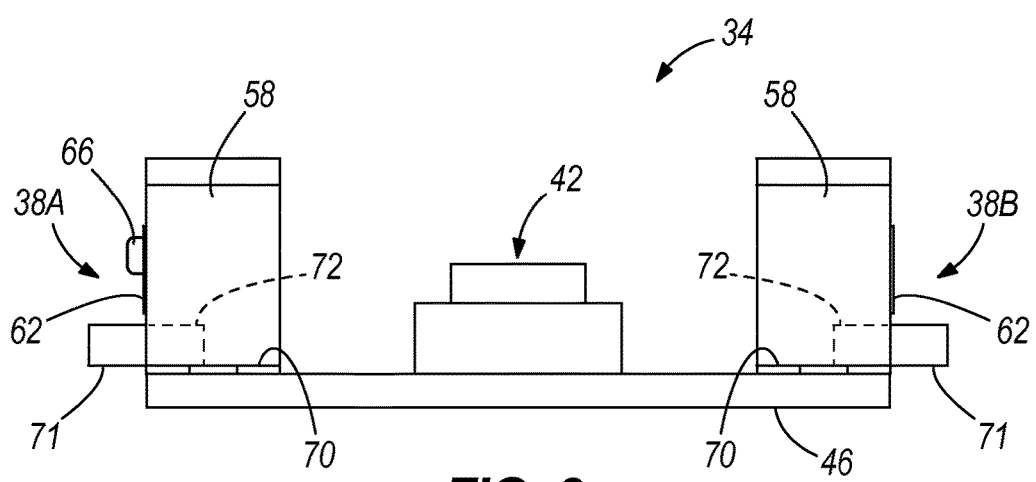
FIG. 2 is a side view of the module shown in FIG. 1.

Referring now to FIGS. 1 and 2, an exemplary module or block 34 of the electronic building system 30 is illustrated (exemplary systems 30 illustrated in FIGS. 3, 4, 7, 9, and 10). The illustrated block 34 is a tact switch module 34 or a pushbutton, and illustrates how discrete electronic components are turned into blocks 34. A pushbutton component 42 is coupled (e.g., soldered) onto a Printed Circuit Board 46 that has two interfaces, the input interface and the output interface. A magnetic connector is mounted at each of the two interfaces. In some exemplary embodiments, the magnetic connectors may be the same type of connector. In other exemplary embodiments, the connectors may include a male connector 38A on the input interface side and a female connector 38B on the output interface side.

The input interface of the tact switch module 34 in FIG. 1 is designed to couple with the output interface of a previous module 34, and the output interface of the illustrated module 34 is designed to couple with the input interface of the next module 34. The module 34 features electrical traces designed to complete connections between two engaging interfaces for a Power line and a Ground line. A Signal line goes through the button 42, which makes or breaks the circuit, and thus transfers a modified Signal line to the output interface corresponding to the module function. In the illustrated exemplary embodiment, the magnetic connectors 38A/B are coupled (e.g., soldered) to the PCB 46 by way of surface mount pads. The above-described drawing also illustrates the modular design of the system 30, as well as the connection and communication standards that make the system 30.

Figure 3:
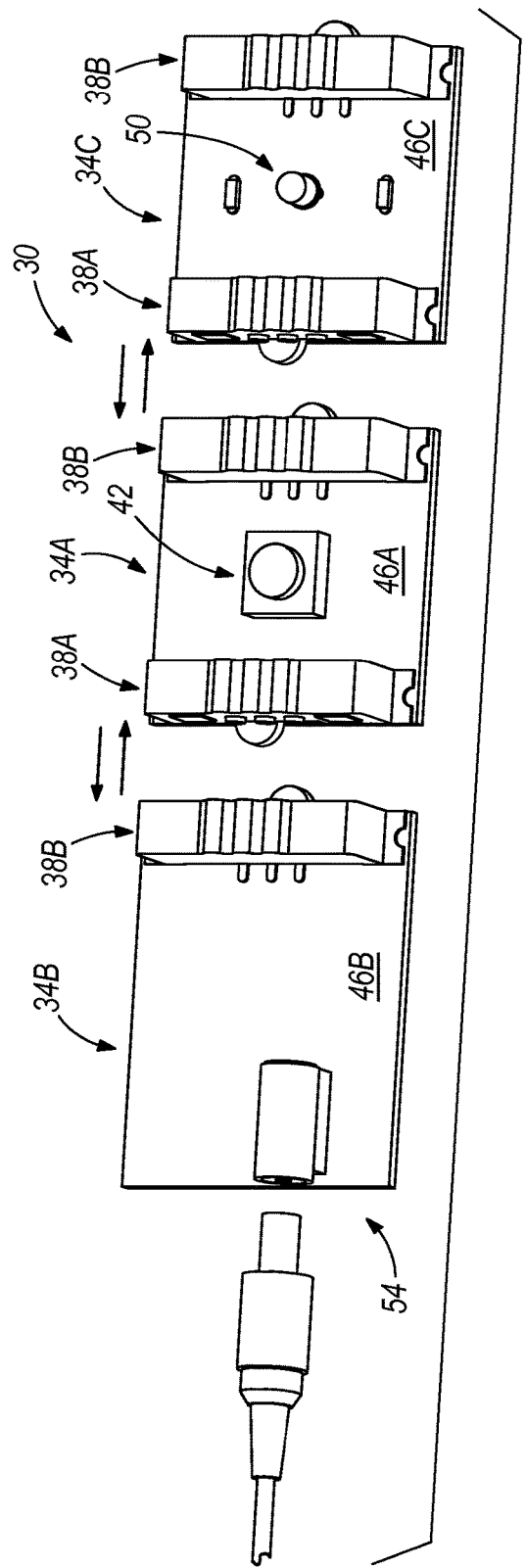
FIG. 3 is a top view of a set of three modules before connecting the three modules.
Figure 4:
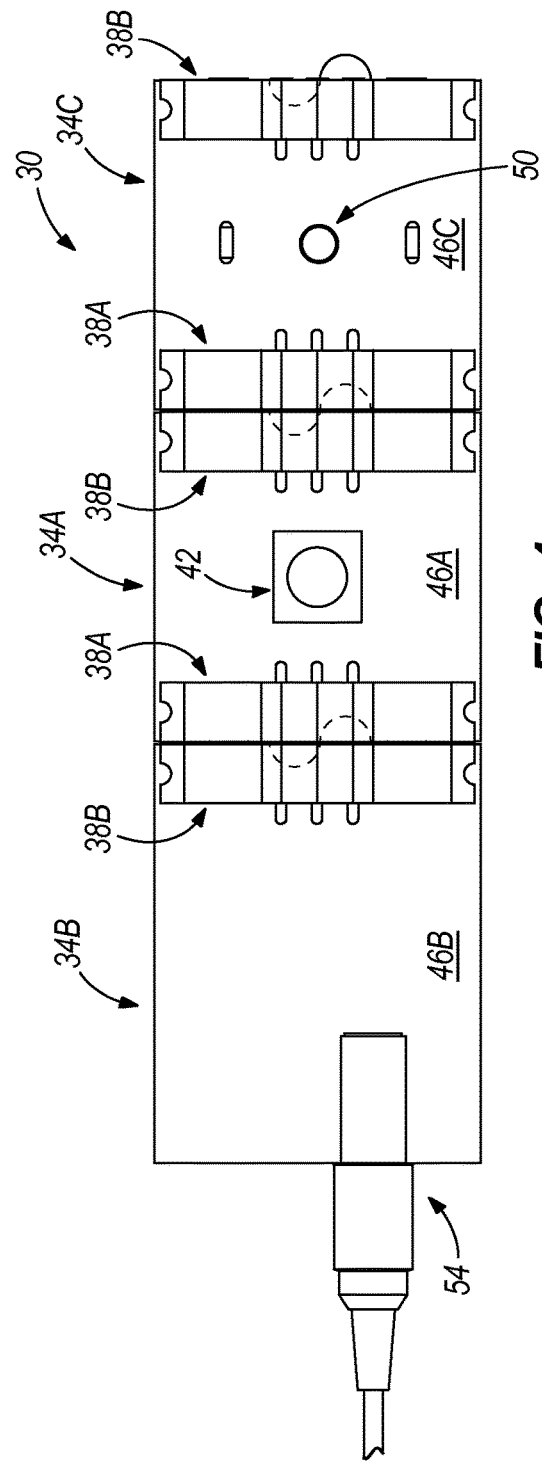
FIG. 4 is a top view of the three modules shown in FIG. 3 after connection to illustrate how the modules connect together using magnetic connectors of the modules.

An exemplary configuration of an electronic building system 30 is illustrated in FIGS. 3 and 4 and includes the exemplary tact switch module shown in FIGS. 1 and 2. In these figures and the figures hereafter, different modules will be identified with a common reference number "34" and a letter (e.g., 34C, 34D, 34E, etc.) associated with each different module. Likewise, similar components between the modules will be identified with similar reference numbers and a letter corresponding to the letter associated with the module (e.g., module 34F, connector 38F, circuit board 46F, etc.).

In FIGS. 3 and 4, an exemplary tact switch module 34A is shown in the middle between a wall power module 34B and a Light Emitting Diode (LED) module 34C. The male connector 38A on the tact switch module 34A is attracted to the female connector 38B on the wall power module 34B via the magnetic connectors described in detail below. The same manner of coupling applies to the tact switch module 34A and the LED module 34C, which contains a dip package LED component 50 coupled (e.g., soldered) to the PCB 46C. When the magnetic connectors in the three illustrated modules 34 couple together as in FIG. 4, and the user pushes down the tact switch 42 of the switch module 34A, the circuit is completed and the LED 50 illuminates. The power module 34B has a power adapter connector 54 that delivers DC voltage to the power module 34B. The pre-integrated circuitry in the power module 34B then drops down the voltage to a required voltage such as, for example, 5 Volts in the present example. Note that if the tact switch module 34A is removed from between the two other modules, the LED module 34C will be attracted to the power module 34B and LED 50 will remain illuminated at all times. In the above mentioned scenario, there is one power block (the wall power), one input block (the switch) and one output block (the LED). It should be understood that the exemplary blocks 34 may be replaced by other blocks 34 having other functionality. For example, the LED block 34C may be replaced by a buzzer block and, when the button is pressed, the buzzer makes an audible sound. Hundreds of other combinations are possible with different blocks having different functionality all forming different circuits, with immediate response of the elements, and without any need for programming, soldering or circuit assembly.

Figure 5:
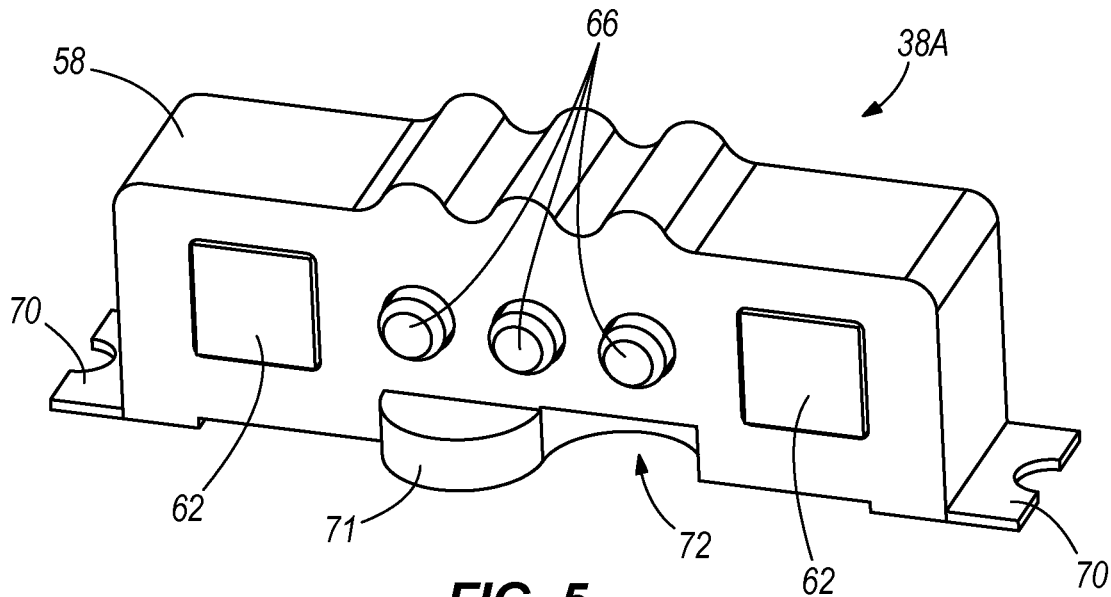
FIG. 5 is a perspective view of an exemplary embodiment of a magnetic connector of a module.
Figure 6:
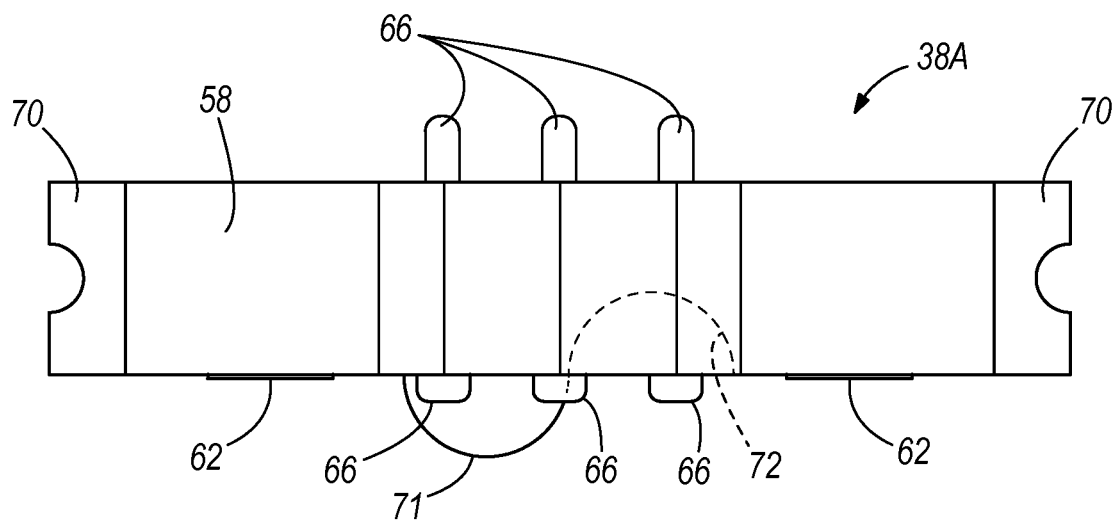
FIG. 6 is a top view of the magnetic connector shown in FIG. 5.

Referring now to FIGS. 5 and 6, an exemplary embodiment of a magnetic connector is illustrated. In the illustrated exemplary embodiment, the connector is a male magnetic connector 38A. Female magnetic connectors may be similar to the male connector except the female connectors may have spring probes 66 that project less from the connector. In some exemplary embodiments, a pair of magnetic connectors 38A/B are electrically coupled to a PCB 46 to provide a module 34. Alternatively, any number of magnetic connectors may be electrically coupled to a PCB 46, including one, and be within the intended spirit and scope of the present invention. The illustrated exemplary magnetic connector 38A, male version here, includes a housing 58 in which two magnets 62 are molded with surface poles exposed that act as the polarizing and locking elements between modules 34. In some exemplary embodiments, the housing 58 may be made of a non-conductive material such as plastic. Embedded in the housing 58 are three electrical conductors or spring probes 66 that are responsible for carrying the current from one module 34 to the next module 34. In addition and for extra support, the magnetic connector 38A is mounted on the PCB 46 through mounting tabs 70 on both sides of the connector 38A. The male connector described above mates with a female connector that looks similar, however, the spring probes 66 in the female connector may be replaced with metal plates, and the magnet exposed surface is opposite to that of the male connector. In other exemplary embodiments, the spring probes 66 in the female connector may be similar to the spring probes 66 in the male connector except they may project less from the connector housing 58 than the spring probes 66 of the male connector. Also note that each connector (both male and female) includes a protrusion 71 and an indentation or receptacle 72 in the housing 58. The protrusions 71 are adapted to insert and mate with indentations 72 in other connectors when the connectors are coupled together. This engagement between protrusions 71 and indentations 72 inhibits the blocks 34 from sliding with respect to each other. This design ensures that blocks 34 couple together to inhibit sliding between the blocks 34 and also facilitate coupling the blocks 34 in the correct manner. Users have a difficult time making mistakes or dangerous electrical connections as is often possible with other electronic components. This makes the present electronic building system 30 accessible and friendly for children, non-engineers, and users who have little or no experience in electronics.

While the connector 38A shown in FIGS. 5 and 6 includes three spring probes 66, any number of spring probes 66, including just one or many more than three, may be used to accommodate electrical current and/or communication from one module 34 to the next module 34. For example, the connector 38A may include four, five, six, or more electrical lines. Further, many means other than spring probes may be used to transmit electrical current and/or communication from one module 34 to another module 34, as would be recognized by one of skill in the art. In each system, the female connector 38B may be structured to appropriately receive the spring probes 66 or other current-transmission means from the male connector 38A, such that current is properly transmitted between the connectors 38A/B and the modules 34. In other exemplary embodiments, the connectors may not include a female connector and a male connector, but, rather, may include two similarly structured connectors that mate and facilitate transfer of electrical current and/or electrical communication from one module 34 to another module 34.

Figure 7:
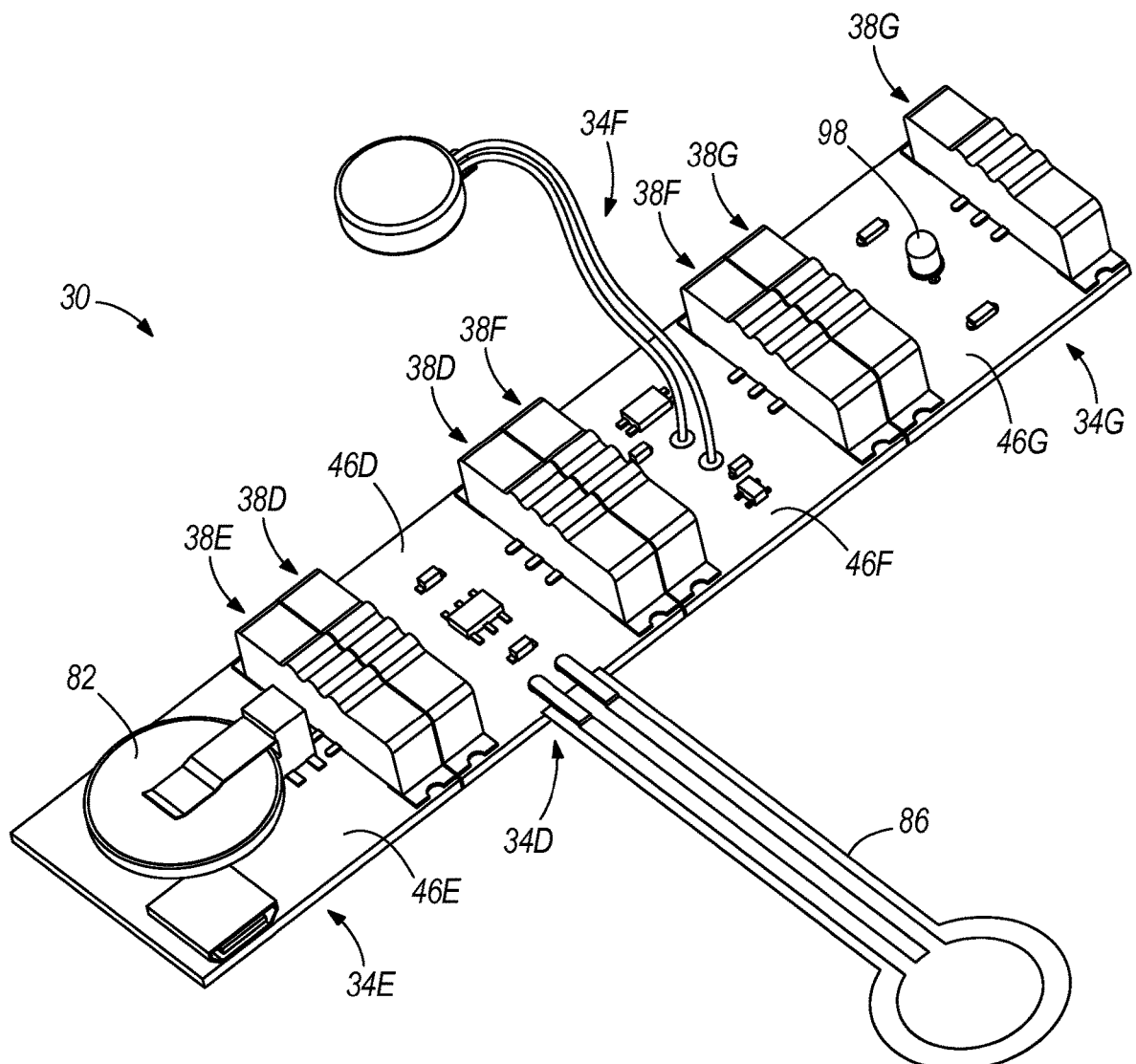
FIG. 7 is an exemplary; configuration of four modules.

With reference to FIG. 7, another exemplary configuration of modules or blocks 34 is illustrated and this exemplary configuration provides a pressure sensor module 34D. In the illustrated exemplary embodiment, the power module is a battery block 34E such as, for example, a coin cell battery block. In this block 34E, a coin battery 82 delivers a little over 3 Volts stepped up to 5 Volts by the illustrated exemplary electronic circuit. The circuit also includes a discharge protection circuit, which demonstrates an example of how the electronic building system 30 may be designed to make the system easier to use and safe for users. The circuit may also include an embedded switch that enables a user to turn on or off the battery block 34E so as not to waste battery power. The next block connected to the battery block 34E is the pressure sensor module 34D, which reads the amount of pressure applied to a pressure sensor component 86 and outputs voltage in the range of 0 to 5 Volts depending on the amount of pressure applied. As more pressure is applied to the pressure sensor component 86, higher voltage transmits to the next modules. In this example, the next modules include a vibrating motor block 34F and an LED block 34G, both of which respectively vibrate more and illuminate brighter as the applied pressure increases. FIGS. 3, 4, and 7, among others, illustrate how the electronic building system 30 is standalone and requires no hardware platform or computer to be connected. The above-described exemplary system could be used, for example, by a child wanting to create his/her version of a carnival's strength meter. As pressure is applied with more strength through a finger or hammer, the toy vibrates more and the LED 98 gets brighter.

In some exemplary embodiments, each module 34 may include control and protection circuitry to facilitate safe and easy operation of the module 34. Additionally, each module 34 may include an operational amplifier component used in a buffer configuration in order to reduce the amount of overall current consumption on the overall system 30 of coupled modules 34. This assists with facilitating the cascading of multiple modules 34 without significant loss of power, as well as scaling the system 30 as may be desired. In other exemplary embodiments, the system 30 may include a booster module in the overall system of coupled modules 34 in order to boost the current and/or power traveling through the power lines and ensure proper functioning of all the modules 34 in the system 30.

Figure 8:
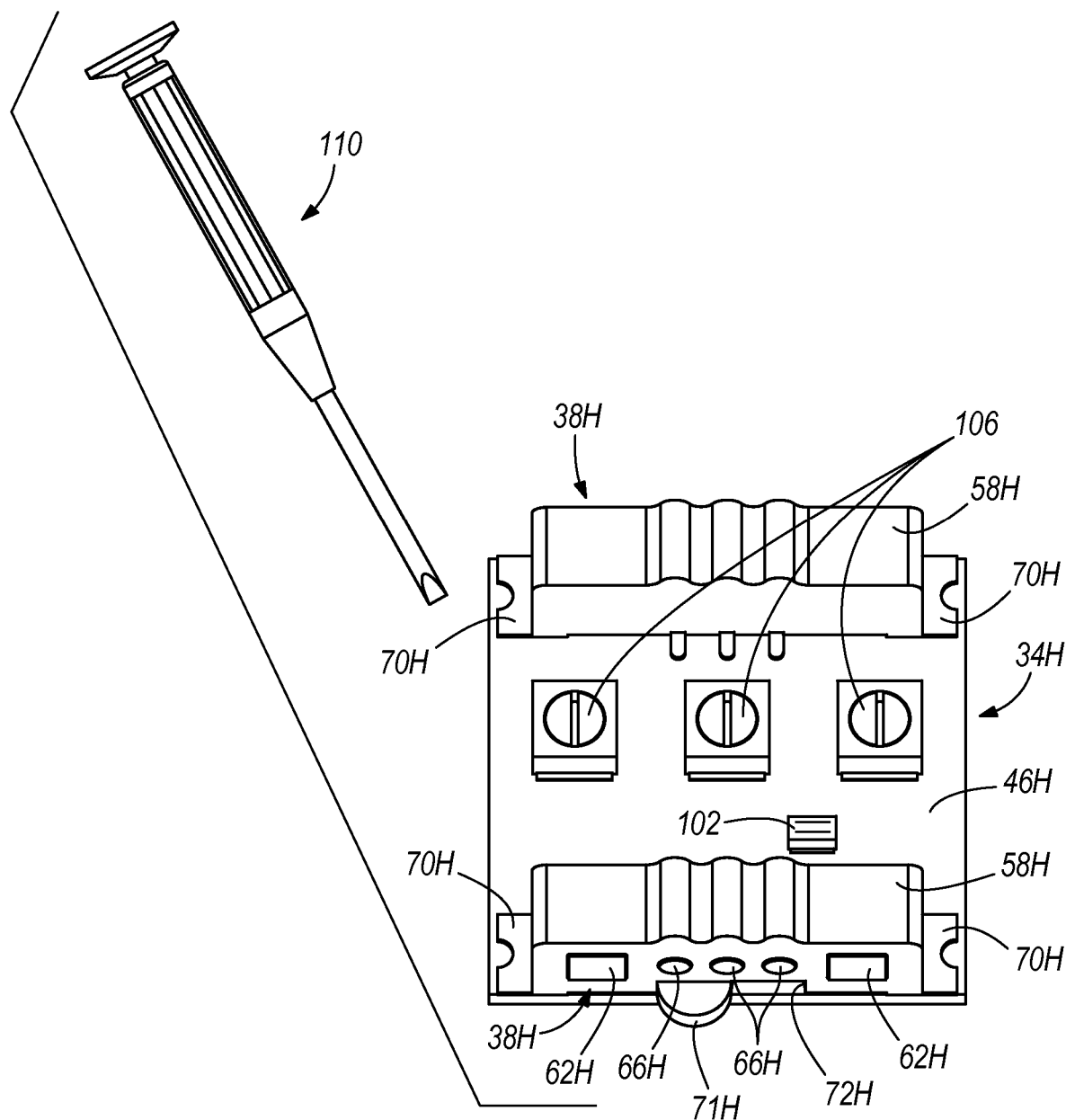
FIG. 8 is a top view of an exemplary module of the system featuring controls.

Beyond being able to produce discrete behaviors by cascading modules 34, the electronic building system 30 allows for programming of certain behavior and aesthetic of the modules 34 through controls. In FIG. 8, an exemplary Red Green Blue (RGB) LED block 34H is shown. In this module 34H, the output color of the RGB LED 102 is controlled by the value of a combination of three potentiometers or knobs 106 provided in the module 34H. By changing the value of each potentiometer (one for Red, one for Green, one for Blue) using a screwdriver 110 or other device, the user is able to adjust the LED 102 to a desired color. In other exemplary embodiments, the potentiometers 106 of this block 34H could be provided off the circuit board itself, and the color of the RGB LED 102 could be modified externally. In further exemplary embodiments, the potentiometers may include knobs or other manually adjustable devices, thereby eliminating the need for tools to perform adjustment.

Figure 9:
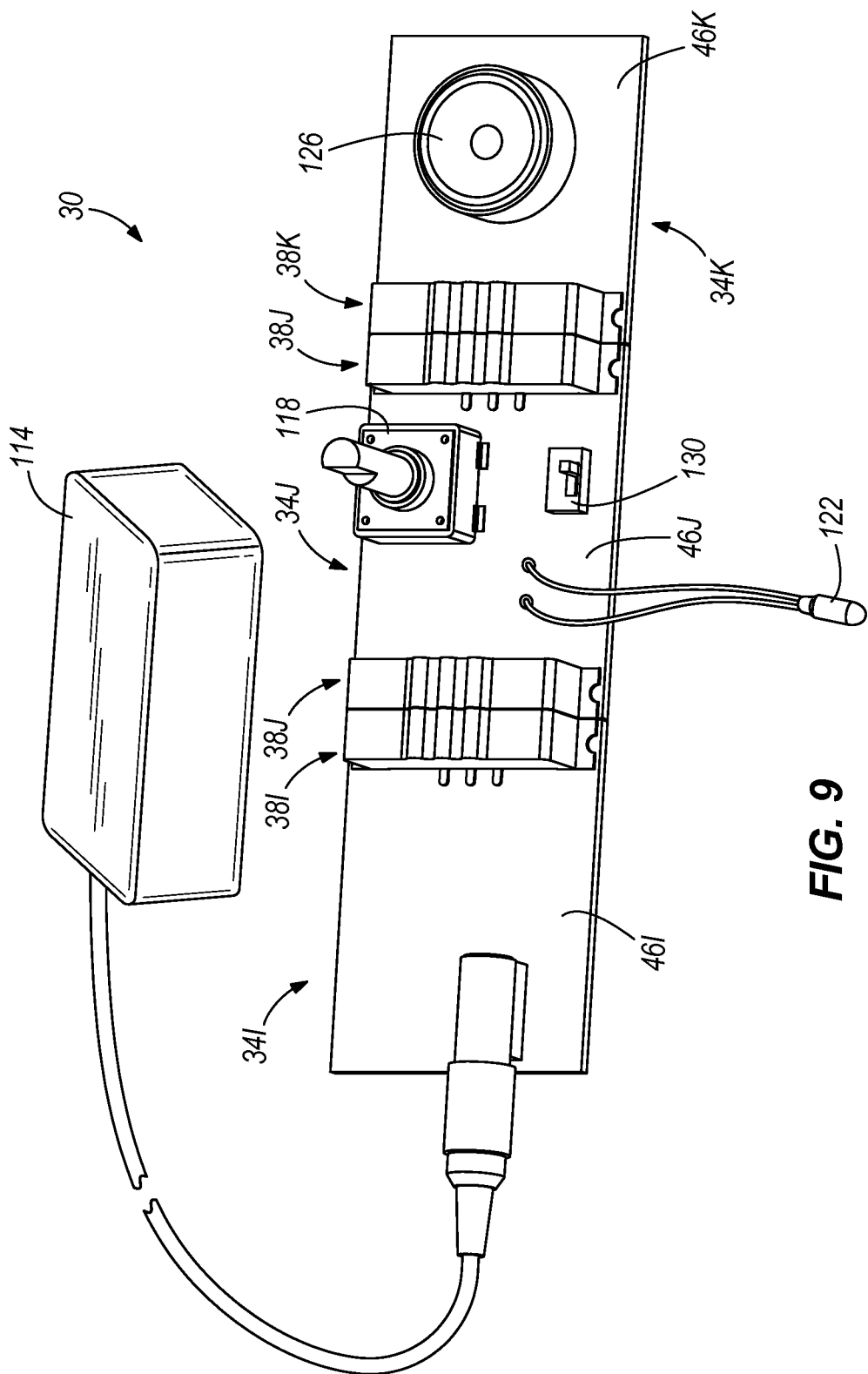
FIG. 9 is a perspective view of an exemplary set of three modules of the system including one module illustrating physical programming through controls.

Yet another example of programming behavior in the electronic building system 30 through controls is shown in FIG. 9. Again, the user is able to program behavior of the circuit by manipulating physical elements and without any code writing. In the illustrated exemplary embodiment, a 9 Volt battery 114 is shown and is part of the power module 341, which is connected to a temperature sensor module 34J including a threshold component, followed by an audio module 34K. In this example, the temperature sensor module 34J may be more advanced than a traditional sensor module. The block 34J features a potentiometer 118 that may be adjusted to set a temperature threshold. If the temperature detected by a temperature sensor 122 is above the set temperature threshold, the module 34J outputs a high reading. This is an example of integrating logic with the simpler analog blocks in order to enable complex circuit configurations. In this example, an output of a high reading from the temperature sensor module 34J will cause the audio module 34K to activate and a speaker 126 to play a prerecorded message associated with a high reading. For instance, this exemplary circuit could be used by a person wishing to have an alarm to turn on the Air Conditioning. When the temperature exceeds a pre-set threshold temperature, the audio module 34K could play back a message "time to turn on the AC!" Also, the audio module 34K may instead be replaced with a fan module, which may activate upon receiving a high temperature reading signal from the temperature sensor module 34J.

In some exemplary embodiments, the temperature sensor module may incorporate a mode switch 130 that can flip the behavior of the block 34J from 'normally-low' to 'normally-high'. In contrast to the first explained configuration (which was normally-low), a 'normally-high' setting would cause the module 34J to output a high reading except when the temperature exceeds the threshold. This means the audio module 34K would be playing recurrently until the room gets warmer, at which point the audio module 34K will cease to output audio. These controls, in addition to pre-programmed blocks, logic blocks and state blocks, will allow the system 30 to enable complex prototypes and circuits with no programming or electronics knowledge.

Figure 10:
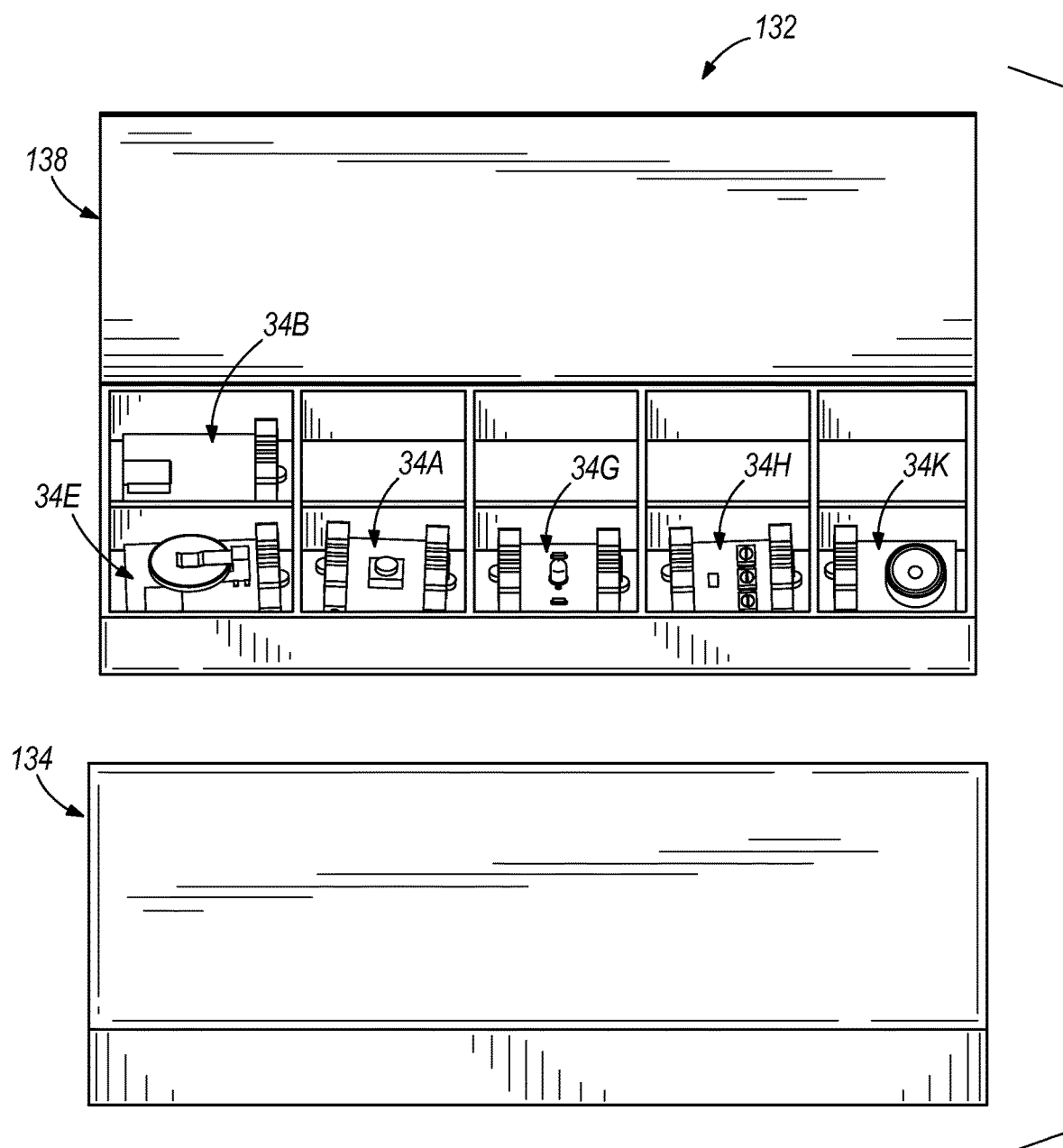
FIG. 10 is a perspective view of an exemplary packaged kit including a plurality of exemplary modules and an exemplary mounting board for mounting modules.

Referring now to FIG. 10, an exemplary kit 132 is illustrated. In the illustrated exemplary embodiment, the kit 132 may include a plurality of modules or blocks 34 and a substrate or mounting board 134, upon which modules 34 may be placed, supported, and or connected. The mounting board 134 may be any size and be made of any material. In some exemplary embodiments, the mounting board 134 is made of a non-conductive material. Additionally, the kit 132 may include a container 138 in which the modules 34 may be stored when not in use. The plurality of blocks 34 and substrate 134 may be the beginning of a kit or library that a user adds to by creating or acquiring new modules and kits, all fitting together as part of the electronic building system 30. The previous descriptions and drawings aim to serve as examples of configurations and modules enabled by the system. These are by no means restrictive or limiting, and those of ordinary skill in the art will understand and appreciate the existence of variations, combinations, and equivalents of the embodiments, methods, and examples herein.

With reference to FIGS. 11-16, the modules 34L, 34M, 34N, 34P, 34Q, and 34R may be uniquely configured to provide a quick visual indication to a user of each module's function. The modules may be uniquely configured in any manner and have any characteristic to identify the functionality of the modules. Additionally, any portion of the module 34 may be uniquely configured and have any characteristic to represent the unique configuration feature. For example, the modules may have a characteristic that uniquely identifies the modules by color-coding, patterning, or may include unique structuring such as shapes, housings, interconnection or couplings, etc. The illustrated exemplary embodiments demonstrate color-coding of the connectors 38 as the exemplary manner of uniquely configuring modules to provide visual indicators as to the function of the modules. However, it should be understood that this exemplary illustrated embodiment of color-coding connectors 38 is not intended to be limiting and the modules may be uniquely configured in any manner and be within the spirit and scope of the present invention. The functionality of the modules identified by the unique configurations and characteristics may be any type or level of functionality. For example, the unique configurations may indicate that the modules are input modules, power modules, wire modules, output modules, etc. In other examples, the unique configurations of the modules may be more specific such as, for example, an LED module, a 9-volt battery module, a cell battery module, a potentiometer module, a switch module, a pressure sensor module, a pulse module, a button module, a vibration motor module, a wire module, etc.

In the illustrated exemplary embodiment, color-coding provides the user with a quick visual confirmation of the type of module, the functionality of the module, as well as allowing the user to learn which color combinations are possible. To represent connectors 38 having various colors in FIGS. 11-16, the connectors 38 are shaded in different manners. Shading connectors 38 in different manners to illustrate various colors is an exemplary manner of representing various colors and is not intended to be limiting. Other manners of representing different colors are contemplated and all of such are intended to be within the spirit and scope of the present invention. Additionally, the connectors 38 are capable of having any color and are not limited to the exemplary colors and associated shading included in the figures.

Figure 13:
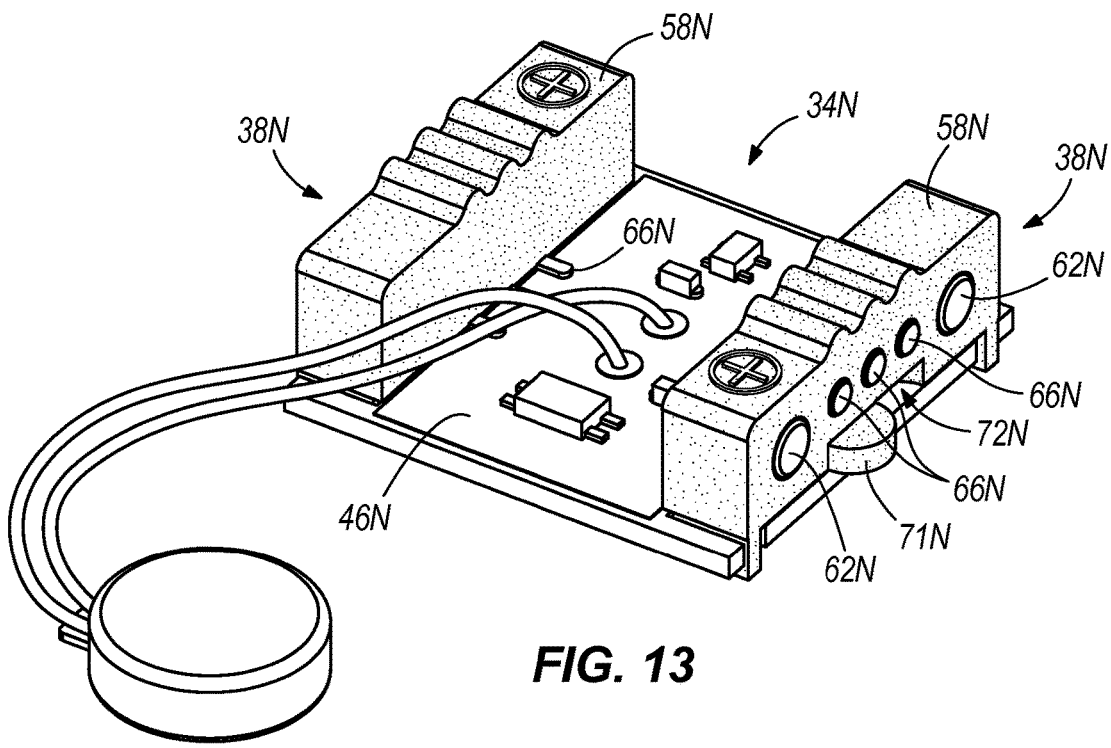
FIG. 13 is a top perspective view of another exemplary output module of the system.
Figure 14:
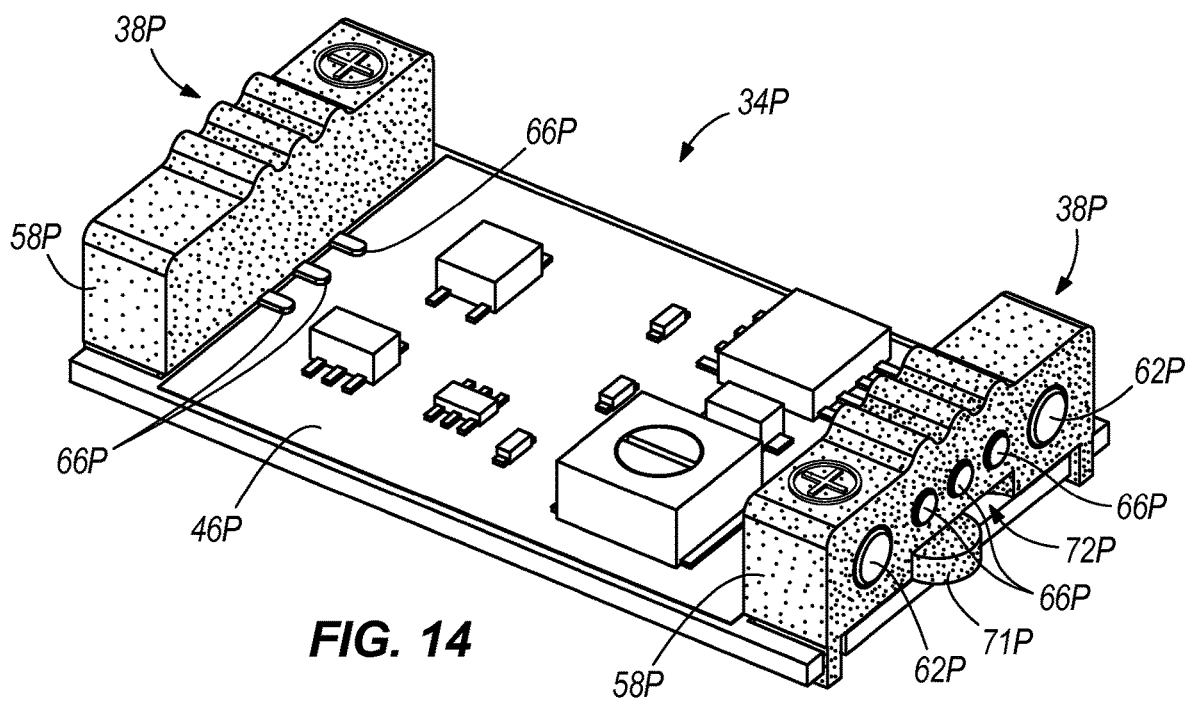
FIG. 14 is a top perspective view of an exemplary input module of the system.
Figure 15:
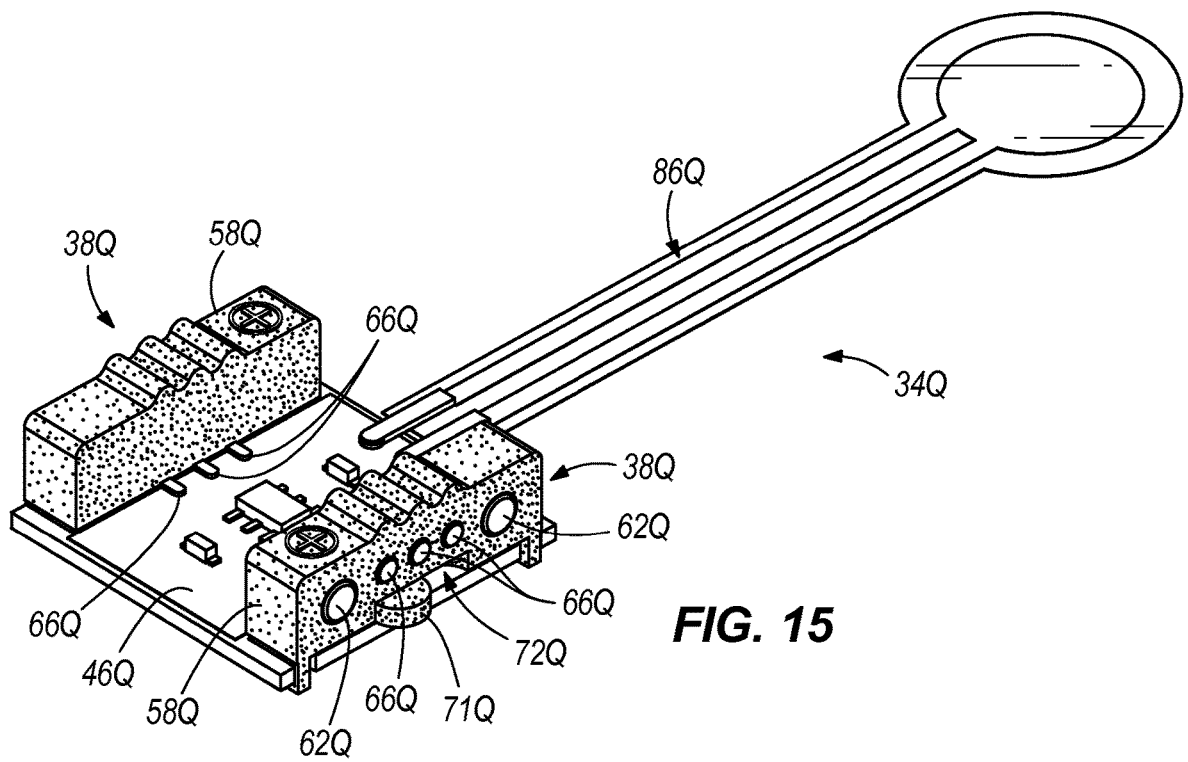
FIG. 15 is a top perspective view of another exemplary input module of the system.

According to one exemplary embodiment as shown in FIG. 11, wire modules 34L may include orange connectors 38L. Upon reading the instruction manual, receiving on-line instruction, or through trial-and-error, the user learns that orange connectors 38L may connect to other orange connectors 38L, to green connectors 38M, 38N of output modules (FIG. 12 depicting a bar graph 34M, and FIG. 13 depicting a vibration motor 34N), and/or to pink connectors 38P, 38Q of input modules (FIG. 14 depicting a pulse module 34P, and FIG. 15 depicting a pressure sensor 34Q), depending on the system 30 the user is attempting to build.

Figure 16:
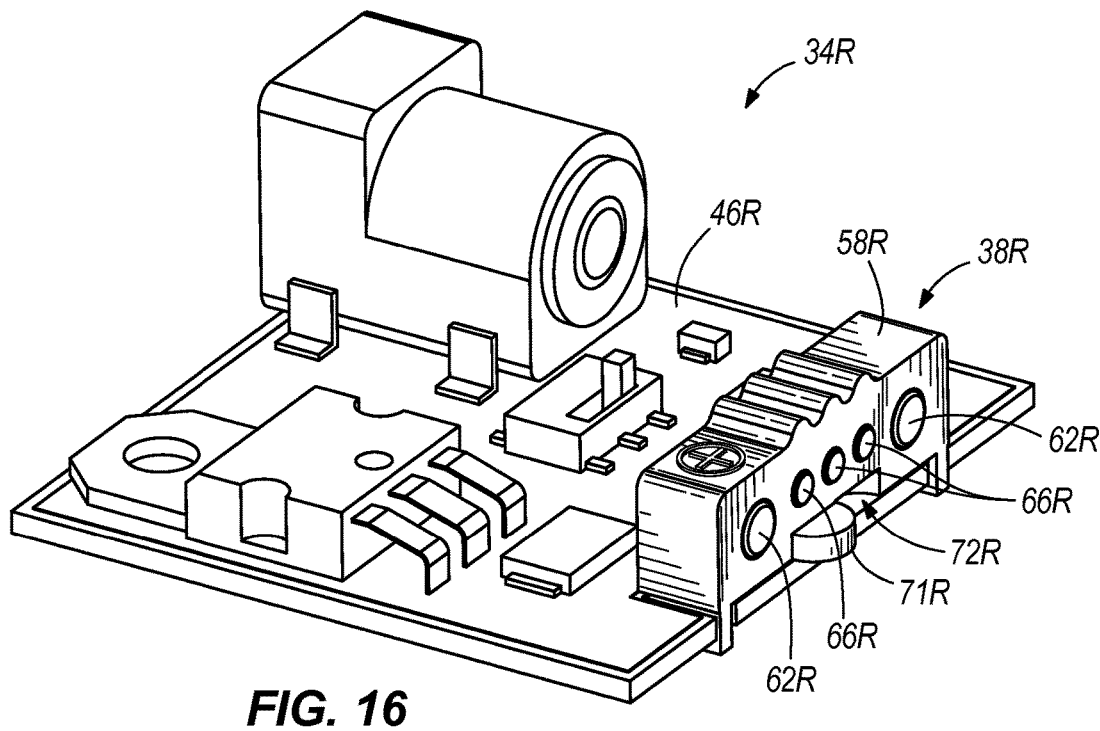
FIG. 16 is a top perspective view of an exemplary power input module of the system.
Figure 17:
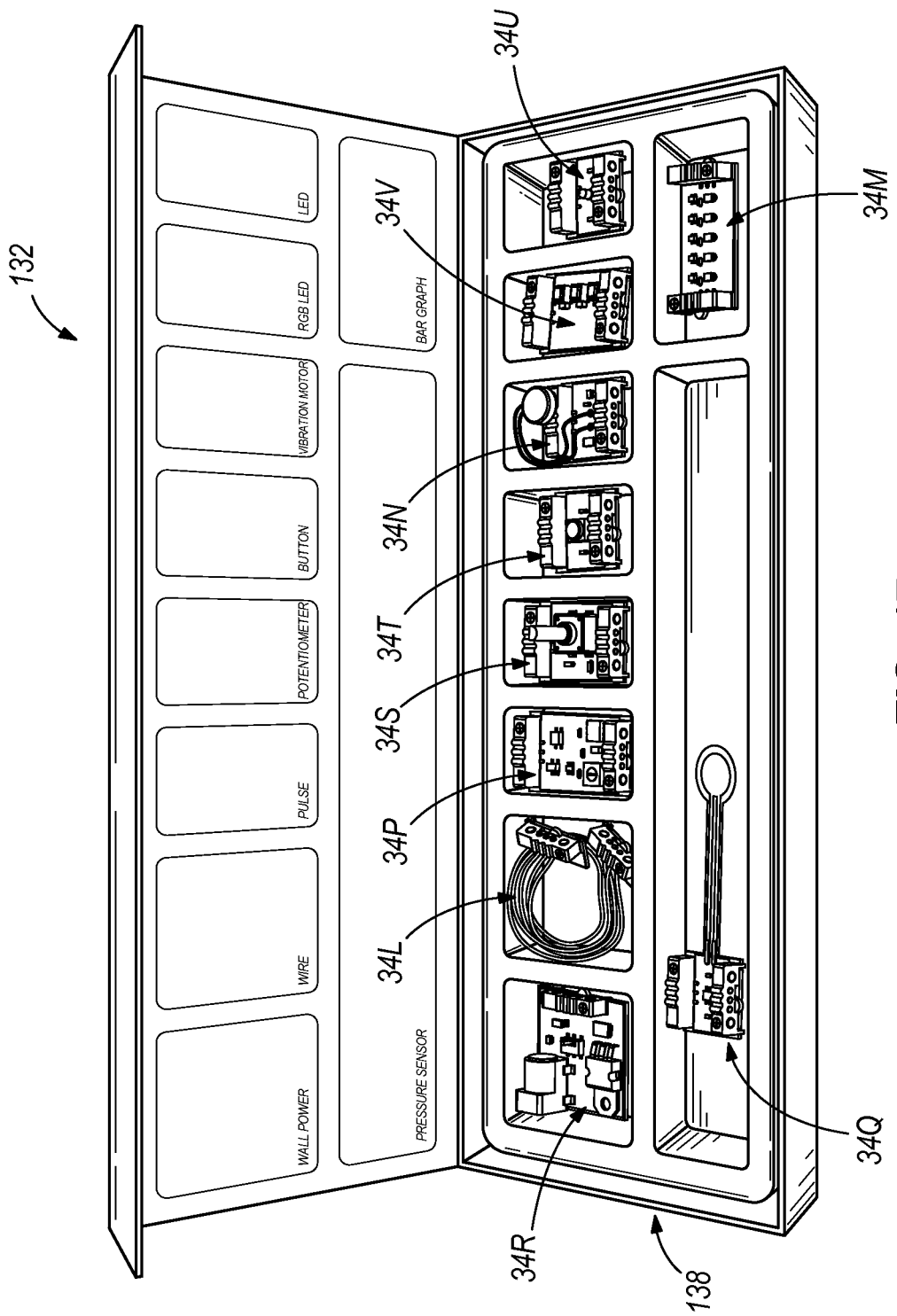
FIG. 17 is a top perspective view of an exemplary multi-module kit of the system.

Each system 30 will likely require a power module (FIG. 16 depicting a wall power module 34R), which will include blue color-coded connectors 38R according to one exemplary embodiment. In this illustrated exemplary embodiment and with reference to FIG. 17 illustrating a kit 132 associated with the exemplary system, the kit 132 may include a blue power module 34R, one or more orange wire modules 34L, a plurality of pink input modules 34P, 34Q, 34S, 34T, and a plurality of green output module 34M, 34N, 34U, 34V. Other exemplary kits may include any number of modules 34 including any possible functionality and be within the intended spirit and scope of the present invention.

Figure 18:
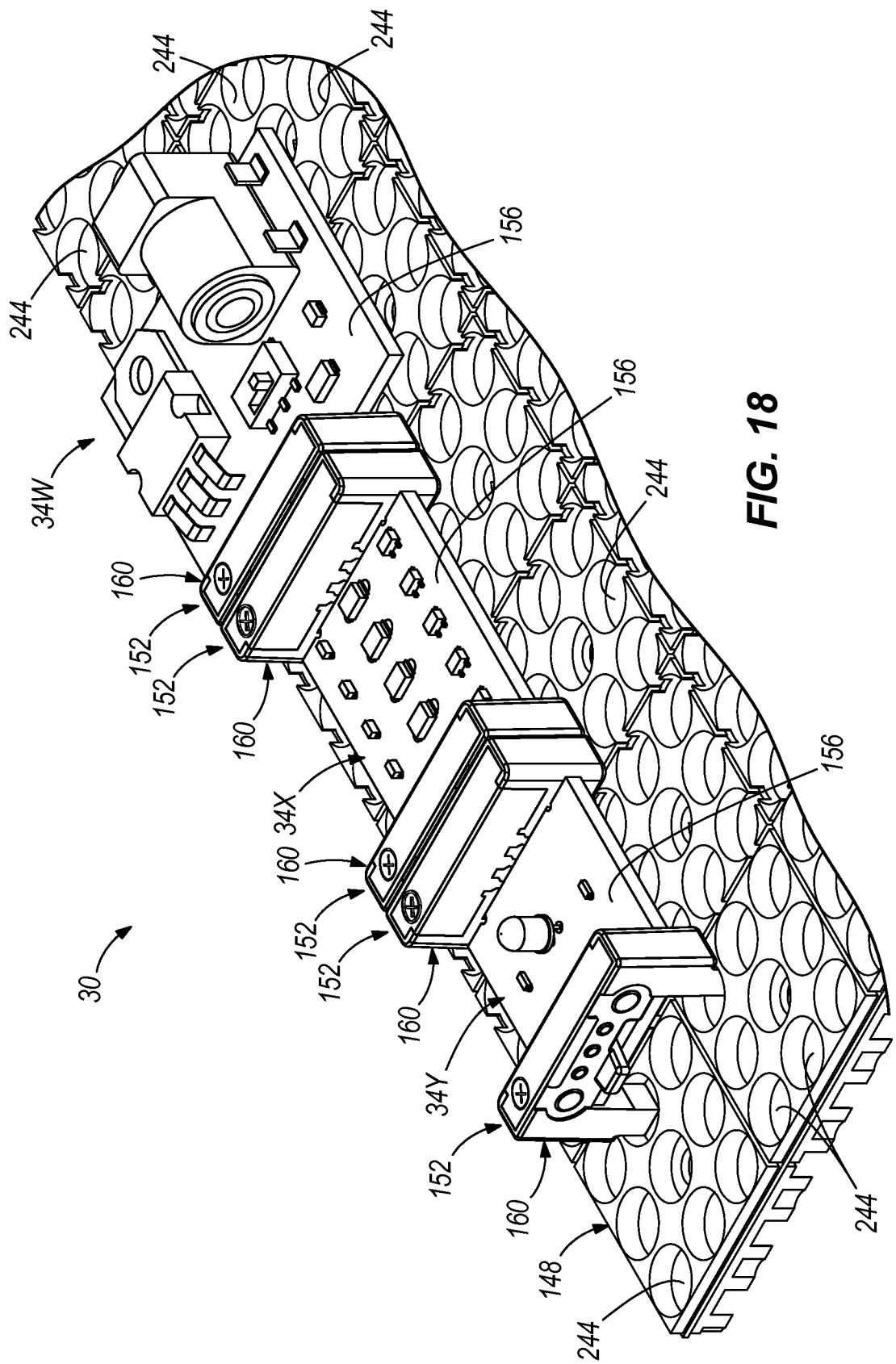
FIG. 18 is a top perspective view of other exemplary modules and another exemplary mounting board of the exemplary system, each module including at least one of another exemplary connector for coupling together modules.

Referring now to FIG. 18, another exemplary system 30 is illustrated including a plurality of exemplary modules 34W, 34X, and 34Y and a mounting board or substrate 148 upon which to couple and support the modules. The system 30 illustrated in FIG. 18 is capable of including any type of module described herein or any other type of module having any type of functionality. Thus, the exemplary modules illustrated and described herein in connection with FIG. 18 are not intended to be limiting. The mounting board 148 may be any size and may be made of any material. In some exemplary embodiments, the mounting board 148 may be 4 inches by 12 inches. In other exemplary embodiments, the mounting board 148 may be made of any non-conductive material. In further exemplary embodiments, the mounting board 148 may be broken up or otherwise separated into smaller portions to a desired size appropriate to the desired application. In such embodiments, the mounting board 148 may either be made of a material and have a configuration that enables breaking or separation of the mounting board 148 into smaller portions, or the mounting board 148 may include perforations, areas of decreased thickness, or other structural characteristics that provide predetermined locations for facilitating easy breaking or separating of the mounting board 148 into smaller portions.

As indicated above, modules are adapted to have a variety of different types of functionality and include the appropriate connectors, circuit boards, and associated electrical components coupled to the circuit boards to perform the desired functionality. The modules shown in the illustrated exemplary embodiment are for exemplary and demonstrative purposes, and are not intended to be limiting. The exemplary illustrated modules include a wall power module 34W (power), a bar graph module 34X (input), and an LED module 34Y (output).

Figure 19:
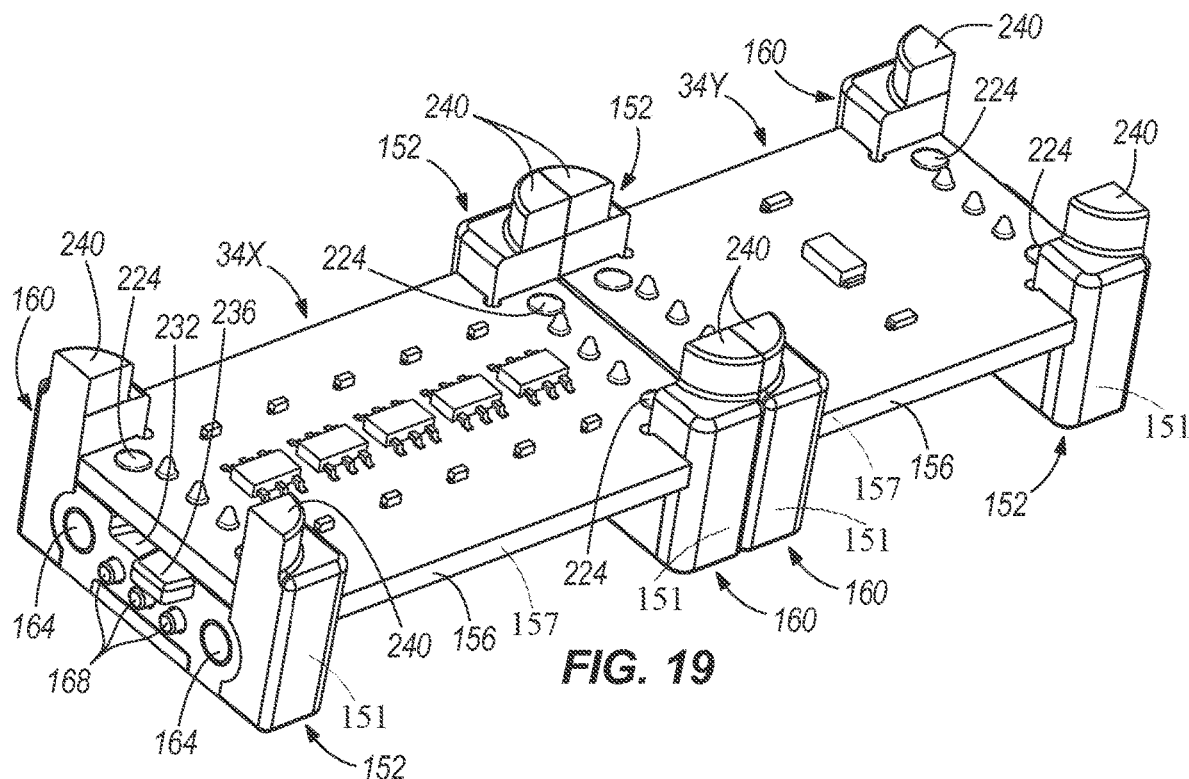
FIG. 19 is a bottom perspective view of two coupled together modules shown in FIG. 18.
Figure 20:
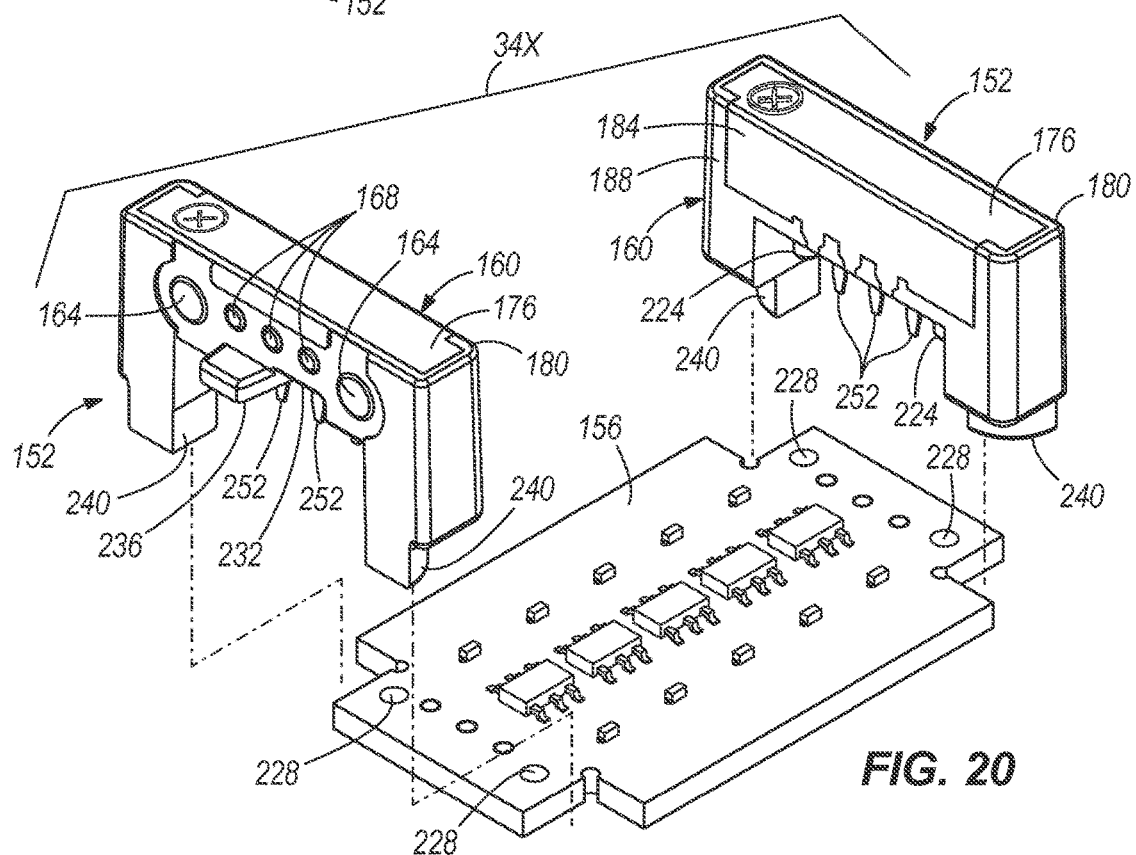
FIG. 20 is a top exploded view of one of the modules shown in FIG. 18.
Figure 21:
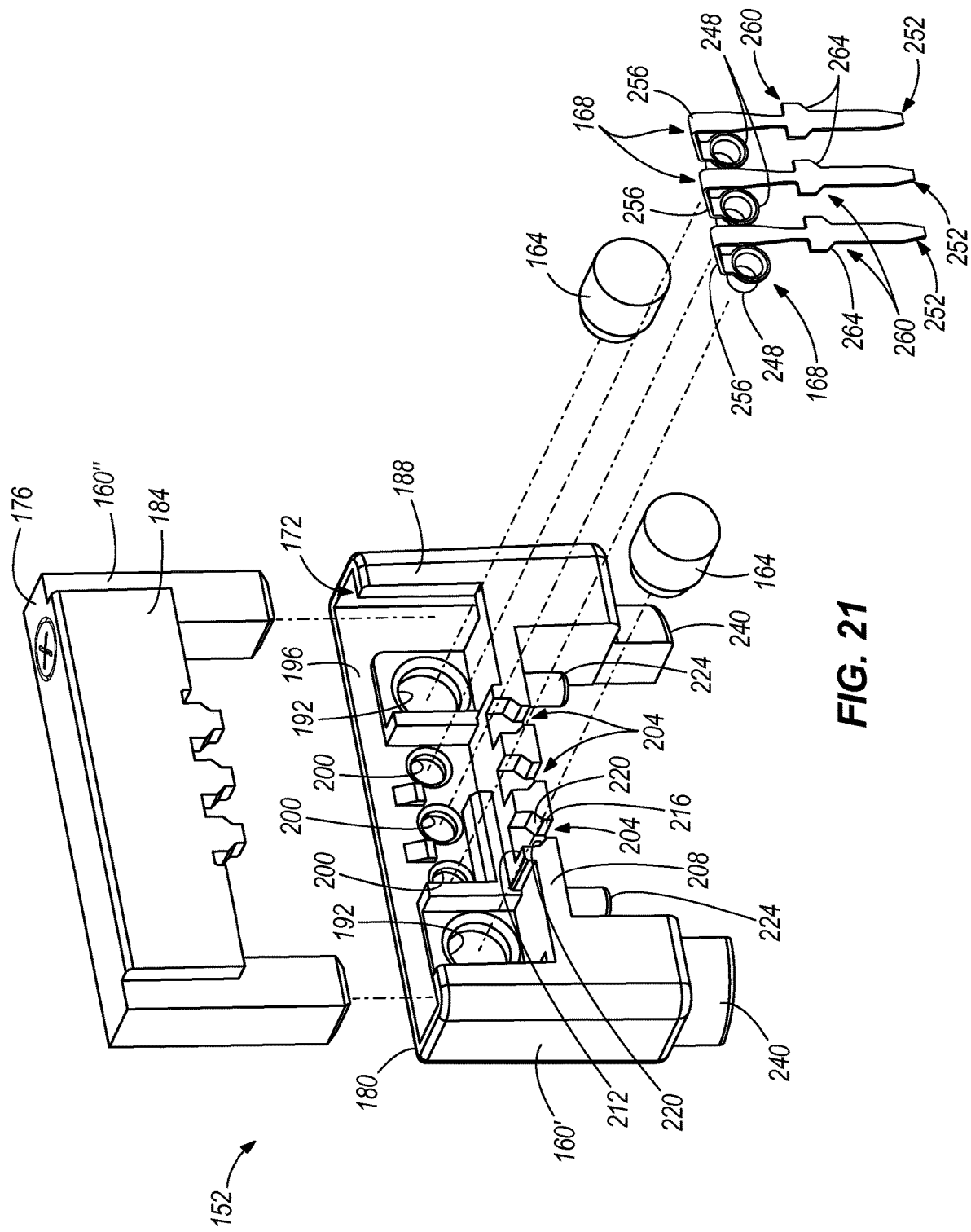
FIG. 21 is a top exploded view of one of the connectors shown in FIG. 18.

Referring now to FIGS. 19-21, each module 34X and 34Y is illustrated and each includes a pair of connectors 152 and a circuit board 156 appropriate to the desired functionality of the module. The module can include the appropriate electrical components to perform the desired functionality of the module. Each connector 152 includes a housing 160 comprised of two portions 160', 160" (see FIG. 21) coupled together, a pair of magnets 164, and a plurality of electrical conductors 168. The two portions of the housing 160 may be coupled together in a variety of manners such as, for example, heat staking, ultrasonic welding, adhesion, press-fit, friction-fit, interference-fit, snap fit or other positive locking manner, etc, and may be made of a variety of different materials such as, for example, plastic (e.g., ABS plastic), or other nonconductive materials. A first portion 160' of the housing defines a cavity 172 for receiving the second portion 160" of the housing therein. The cavity 172 is complementarily shaped to the second portion 160" to ensure a top surface 176 of the second portion 160" is substantially flush with a top surface 180 of the first portion 160' (see FIGS. 20 and 21) and a side surface 184 of the second portion 160" is flush with a side surface 188 of the first portion 160' when the two portions 160', 160" are coupled together.

The first portion 160' of the housing also defines a pair of magnet apertures 192 (see FIG. 21) in a side surface 196 thereof in which the magnets 164 are supported. In the illustrated embodiment, the magnets 164 are cylindrical in shape, thereby providing a circular cross-section taken along a plane perpendicular to a longitudinal extent of the magnet 164. Thus, the magnet apertures 192 defined in the first portion 160' of the housing are circular in shape. It should be understood that the magnets 164 may having any shape and the magnet apertures 192 may similarly have any shape that complements the shape of the magnets 164. For example, if the cross-sectional shape of the magnets is square, then the magnet apertures in the first portion of the housing may be square. In other exemplary embodiments, the magnet apertures may have shapes that are not complementary to the shape of the magnet. In such embodiments, the magnetic aperture may be any shape that inhibits the magnet from passing through the magnetic aperture and escaping the housing 160 of the connector. For example, the magnet may be cylindrical in shape, thereby providing a circular cross-section, and the magnet aperture may be square such that the square is sized sufficiently small to inhibit the magnet from passing through the aperture.

Additionally, the first portion 160' of the housing defines electrical conductor apertures 200 in the side surface 196 thereof for receiving and supporting a portion of the electrical conductors 168 (described in more detail below). In the illustrated exemplary embodiment, the electrical conductor apertures 200 are circular in shape complementary to the shape of a portion of the electrical conductors 168 received therein. Similarly to the magnet apertures 192, the electrical conductor apertures 200 may have any shape and be complementary to the shape of a portion of the electrical conductors 168 received therein.

The first portion 160' of the housing further defines a plurality of conductor slots 204 (see FIG. 21) in a bottom surface 208 thereof for receiving the conductors 168 therein when the housing 160 is assembled. Each conductor slot 204 includes an upper end 212 having a first dimension, a bottom end 216 having a second dimension smaller than the first dimension, and tapered side surfaces 220 tapering from large to small from the upper end 212 to the lower end 216. The shape of the conductor slots 204 is complementary to the shape of the electrical conductors 168 in order to provide sufficient support to the electrical conductors 168 when the housing 160 is assembled.

Further, the first portion 160' of the housing includes a pair of projections 224 extending downward from a bottom surface 208 thereof for coupling the connector 152 to the circuit board 156 of the module 34. In the illustrated exemplary embodiment, the projections 224 are cylindrical in shape and may insert into apertures 228 (see FIG. 20) defined in the circuit board 156. Subsequently to inserting the projections 224 into the circuit board apertures 228, the projections 224 may be deformed to inhibit them from withdrawing from the apertures 228 in the circuit board 156. The projections 224 may be deformed in a variety of different manners such as, for example, melting or heating the projections 224, bending, smashing, or any other manner that sufficiently deforms the projections 224 to inhibit them from withdrawing from the apertures 228 in the circuit board 156.

The housing 160 also defines a receptacle 232 in a side surface thereof and includes a projection 236 extending from the side surface and positioned adjacent the receptacle 232. Such a receptacle 232 and projection 236 are included in each connector housing 160 and assist with proper alignment and coupling together of modules 34. The receptacle 232 is shaped complementary to a shape of the projection 236 such that when a projection 236 is received in the receptacle 232 the projection 236 substantially fills the receptacle 232. When coupling two modules 34 together, such as modules 34X and 34Y, the connectors 152 are aligned with the projection 236 on each connector 152 substantially aligned with the receptacle 232 on the other connector 152, and the modules 34X and 34Y are moved together until the magnetic force of the four magnets 164 on the two connectors 152 is sufficient to pull the connectors 152 together, thereby causing the projections 236 to insert into the receptacles 232. Upon connection, the projections 236 and receptacles 232 of the connectors 152 cooperate to inhibit substantial lateral and vertical movement of the modules 34X and 34Y relative to one another.

With continued reference to FIGS. 19-21, the first portion 160' of the housing includes a pair of mounting members 240 extending downward there from and adapted to engage complementarily shaped receptacles 244 defined in the mounting board 148 (see FIG. 18). The mounting members 240 and the receptacles 244 are configured to provide adequate support to the modules 34 when mounted on the mounting board 148. In the illustrated exemplary embodiment, the mounting members 240 have a shape comprised of a quarter of a circle and the receptacles 244 on the mounting board 148 are circular in shape (see, e.g., FIG. 19 regarding mounting members 240). When two connectors 152 on adjacent modules 34 are coupled together, the two mounting members 240 on the two connectors 152 form a semicircle that may friction fit into the receptacles 244 in the mounting board 148. The circuit board 156 can have various lengths and widths configured to provide appropriate spacing between the modules 34 and the mounting board 148. For example, as shown in FIG. 18, the circuit board 156 included in module 34Y has a length such that with the connectors 152 disposed on each end of the circuit board 156, the mounting members 240 on one end of the circuit board 156 are disposed within receptacles 244 that are spaced four receptacles away from the receptacles 244 in which the mounting members 240 on the opposite end of the circuit board 156 are disposed. Said another way, there are three receptacles 244 between connectors 152 on the opposite ends of the circuit board 156 of module 34Y. In another example, the circuit board 156 included in module 34X shown in FIG. 18, has a length that is longer than a length of the circuit board of module 34Y. For module 34X, the connectors 152 disposed on each end of the circuit board 156 are disposed in receptacles 244 that are spaced five receptacles away from the receptacles 244 in which the mounting members 240 on the opposite end of the circuit board 156 of module 34X are disposed. In this example, there are four receptacles 244 between the connector 152 on the opposite ends of the circuit board 156 of module 34Y. Thus, the circuit board 156 can be provided with various lengths, while also accommodating appropriate spacing between receptacles 244 on the mounting board 148.

In addition, when two connectors 152 are coupled together as shown in FIG. 19, an outer edge surface 157 of the circuit board 156 can be disposed substantially flush with an outer surface 151 of the connectors 152. Alternatively, the outer edge surface of the circuit board can be disposed inward or outward of the outer surface of the connectors. In other words, in such alternatives, the outer edge surface is not flush with the outer surface of the connectors.

With continued reference to FIGS. 19-21, the electrical conductors 168 have a spring characteristic that allows for movement of the conductors 168 as a result of forces applied thereto. This spring characteristic that facilitates movement of the conductors 168 helps maintain contact with electrical conductors 168 on an adjacent module 34 coupled to the present module 34 during manipulation of the modules 34. Such manipulation may result in forces applied to the modules 34 causing movement of the modules 34 relative to one another. In some embodiments, the electrical conductors 168 on adjacent modules can have different lengths such that the electrical conductors 168 extend from the housing 160 at varying distances. For example, the electrical conductors 168 shown in FIG. 19 have a length that is greater than a length of the electrical conductors 168 shown in FIG. 20. In such embodiments, a connector 152 having electrical conductors 168 such as those in FIG. 19 can be coupled to a connector 152 having electrical conductors 168 such as those shown in FIG. 20, and the corresponding electrical conductors 168 can exert a spring-force (or bias-force) on each other to substantially maintain the positioning of the coupled sets of electrical conductors 168 while the two connectors 152 are coupled together. In other words, as described above for previous embodiments, a connector 152 can be a male connector or a female connector that can be matingly coupled together with the other type of connector (e.g., a female connector or a male connector, respectively). In the illustrated exemplary embodiment, each electrical conductor 168 includes an engagement portion 248 (see FIG. 21) positioned within a respective electrical conductor aperture 200, a coupling portion 252 extending downward and adapted to engage and electrically communicate with the circuit board 156, and a middle portion 256 (see FIG. 21) extending between the engagement portion 248 and the coupling portion 252. The engagement portion 248 is adapted to engage an electrical conductor 168 of an adjacent module 34 coupled to the present module 34. Due to the electrical conductor 168 being made of a conductive material, the electrical current travels through the electrical conductor 168 of the present module 34 to its circuit board 156. Each electrical conductor 168 includes an enlarged portion 260 (see FIG. 21) positioned between ends of the conductor 168 that fits into a respective conductor slot 204. The enlarged portion 260 has a complementary shape to the conductor slot 204 to provide vertical and horizontal support to the electrical conductor 168 when the housing 160 is assembled. In the illustrated exemplary embodiment, the enlarged portion 260 includes a tapered portion 264 (see FIG. 21) that complements the tapered surfaces 220 of the conductor slot 204.

Referring now to FIGS. 22 and 23, a support member 268 is coupled to two coupled together modules 34 to provide additional support to the coupled modules 34. In some exemplary embodiments, the support member 268 is used instead of the mounting board 148 to provide modules 34 with additional support. In other exemplary embodiments, the support member 268 may be configured to allow both the support member 268 and the mounting board 148 to provide support to two coupled together modules 34. In the illustrated exemplary embodiment, the support member 268 includes a pair of receptacles 280 defined in a top surface 276 thereof for receiving mounting members 240 of coupled together modules 34. The receptacles 280 in the support members 268 are similarly sized, shaped and spaced apart as the receptacles 244 in the mounting board 148. The support member 268 also has a height H that, when two modules 34 are coupled to each other and to the support member 268, a top surface 276 of the support member 268 is substantially flush with and mates or engages with a bottom surface 288 of the housing 160. Also in the illustrated exemplary embodiment, the support member 268 includes a width W1 that is substantially similar to a width W2 of two coupled together connectors 152 and a length L1 that is substantially similar to a length L2 of the two coupled together modules 34. Alternatively, the support member 268 may have configurations different than the illustrated exemplary embodiment as long as the support member 268 provides support to coupled together modules 34. When multiple modules 34 in a system 30 are coupled together, a support member 268 may be coupled to each pair of coupled together connectors 152 in the system 30. Thus, the system 30 may include any number of support members 268 therein and be within the intended spirit and scope of the present invention.

Figure 24:
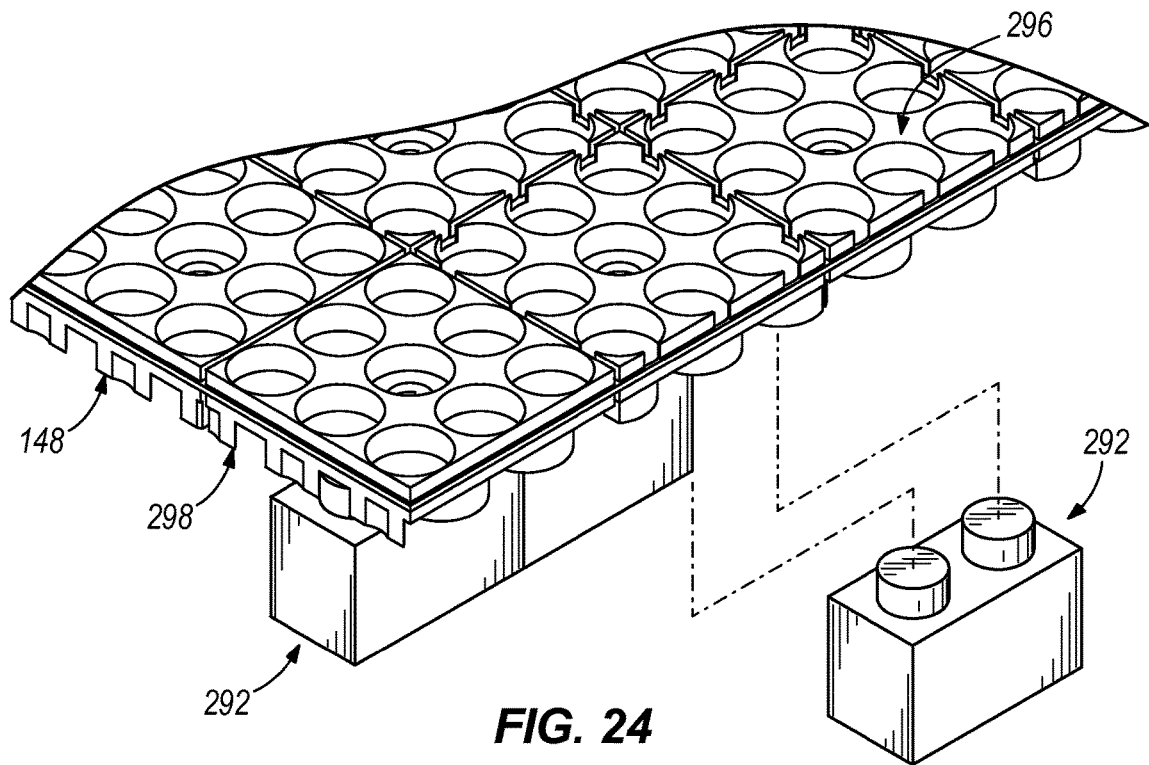
FIG. 24 is a top perspective view of an exemplary mounting board coupled to an exemplary configuration of toy building blocks.
Figure 25:
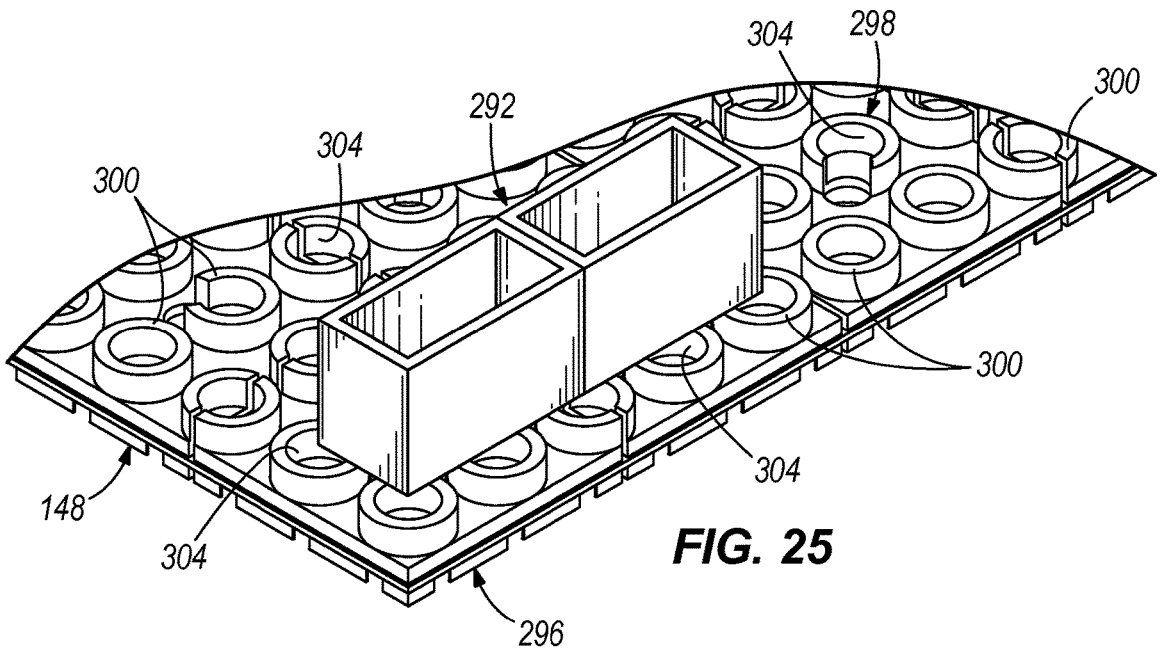
FIG. 25 is a bottom perspective view of the mounting board and exemplary toy building blocks shown in FIG. 24.

The exemplary systems 30 disclosed herein are adapted to cooperate with other types of systems to bring the functionality and features of the exemplary systems 30 to the other types of systems. The exemplary systems 30 may cooperate with any type of other system and be within the intended spirit and scope of the present invention. With reference to FIGS. 24 and 25, an exemplary mounting board 148 of an exemplary system 30 of the present invention is shown cooperating with a toy building block system 292 such as, for example, a LEGO® building block system 292. The illustrated exemplary systems are not intended to be limiting, but, rather, are for exemplary and demonstrative purposes. In the illustrated exemplary embodiment, the mounting board 148 is configured to cooperate with the exemplary LEGO® building block system 292 and, in particular, is configured to couple to a LEGO® building block system 292. A first side 296 of the mounting board 148 (e.g., a top side) includes the plurality of receptacles 244 appropriately spaced for receiving connectors 152 of modules 34. A second side 298 of the mounting board 148 (e.g., a bottom side) includes a plurality of projections 300 having cavities 304 defined therein that are appropriately spaced from one another to facilitate coupling to the LEGO® building block system 292. As indicated above, the systems 30 of the present invention may couple to any type of other systems and, accordingly, the second side 298 of the mounting board 148 may be configured in any manner to accommodate any type of other system to which the mounting board 148 is intended to couple.

It should be understood that the structures, features, functionality, and other characteristics of the various exemplary embodiments of the systems disclosed herein and illustrated in FIGS. 1-25 may be combined with each other in any manner and in any combination and all such manners and combinations are intended to be within the spirit and scope of the present invention. For example, an adapter(s) or foot member can be included to adjust the height of a connector such that different connector embodiments can be coupled to a common circuit board or different circuit board/connector combinations can be coupled together. For example, an adapter can be coupled to a bottom portion of the connector 38A (see FIG. 5) to increase a length or height of the connector 38A such that the connector 38A can be coupled to a circuit board 156 along with a connector 152. In another example, an adapter can be coupled to a bottom portion of the connector 38M (see FIG. 12) to increase a length or height of the connector 38M relative to a circuit board such that the connector 38M can be coupled to a different circuit board 156 having a connector 152. Such adapters can be, for example, adhesively coupled to a bottom portion of the connector 38A or connector 38M. In some embodiments, the adapter can include a mounting member or portion similar to the mounting members 240 described above, such that the adapter can engage complementarily shaped receptacles (e.g., receptacles 244 described above) defined in a mounting board (e.g., mounting board 148 shown in FIG. 18).

Although embodiments of modules 34 are shown and described as having a connector (e.g., connectors 38 and 152) coupled to one end or two opposite ends or edges of a circuit board (e.g., circuit boards 46 and 156), in other embodiments, a module 34 can include connectors coupled to more than two ends or edges of a circuit board. For example, FIGS. 26A-26D are each a schematic illustration of a top view of a module including a circuit board and one or more connectors. The modules of FIGS. 26A-26D can include various different embodiments of a connector and/or circuit board as described herein.

Figure 26A:
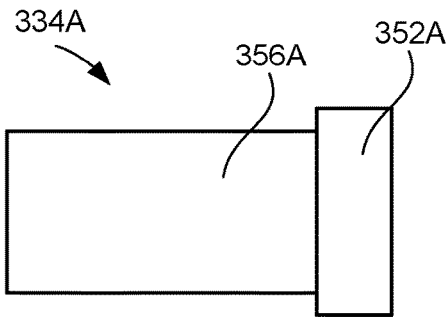
FIGS. 26A-26D are each a schematic illustration of a top view of a different embodiment of a module.
Figure 26B:
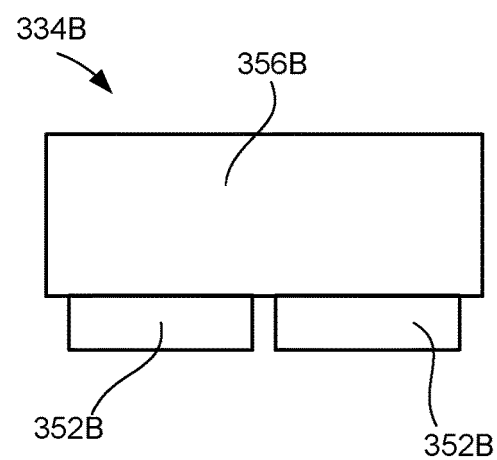
Figure 26C:
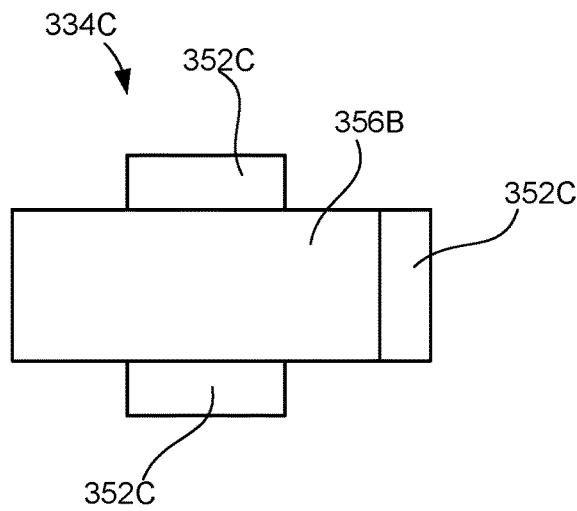
Figure 26D:
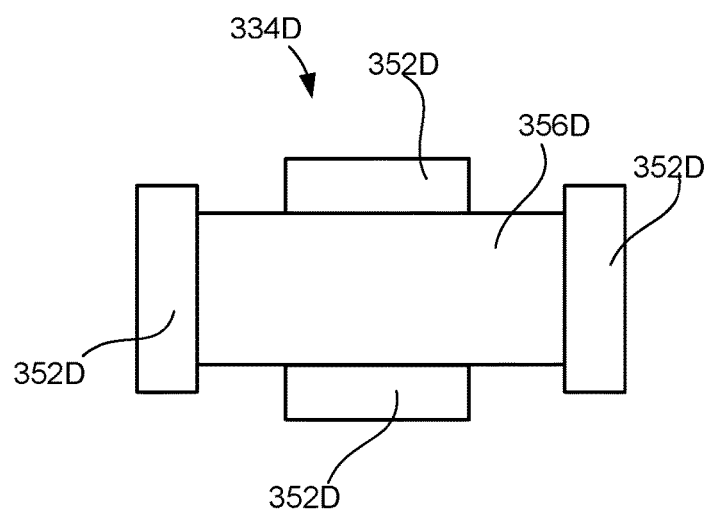

FIG. 26A illustrates a module 334A including a circuit board 356A, and one connector 352A coupled to a single edge or end portion of the circuit board 356A. FIG. 26B illustrates a module 334B including a circuit board 356B, and two connectors 352B coupled to a single edge or end portion of the circuit board 356B. FIG. 26C illustrates a module 334C including a circuit board 356C, and three connectors 352C coupled to three different edges or end portions of the circuit board 356C. FIG. 26D illustrates a module 334D including a circuit board 356D, and four connectors 352D coupled to four different edges or end portions of the circuit board 356D.

Figure 27A:
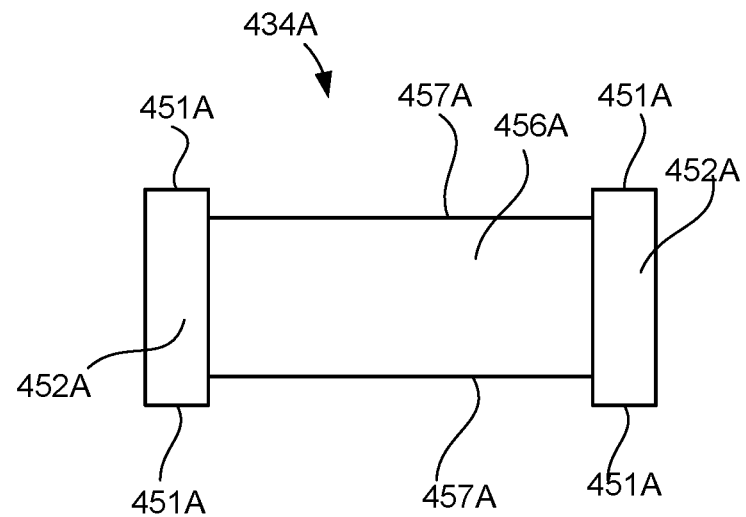
FIGS. 27A-27B are each a schematic illustration of a top view of a different embodiment of a module.
Figure 27B:
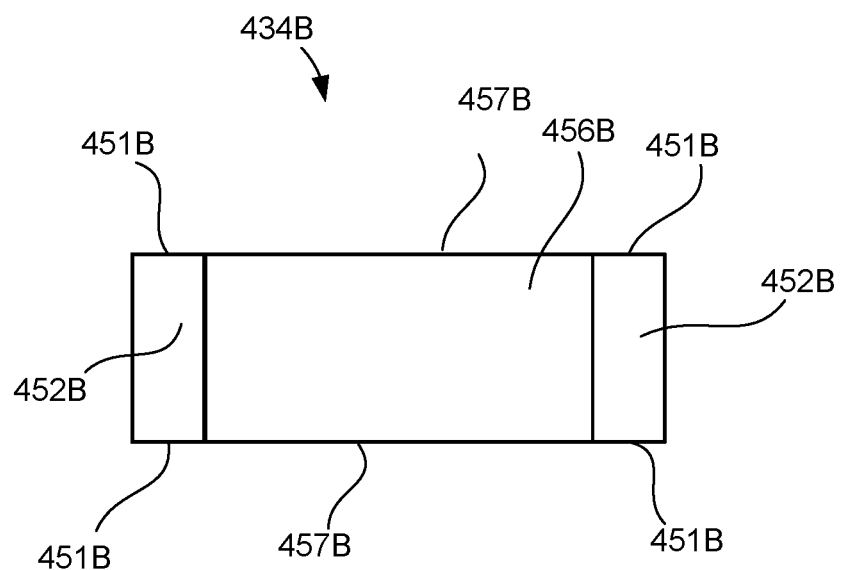

FIGS. 27A and 27B are schematic illustrations of embodiments of a module showing side edges of a circuit board in relation to a side edge or surface of a connector. FIG. 27A illustrates a module 434A having a circuit board 456A and two connectors 452A coupled to the circuit board 456A. In this embodiment, when the connectors 452A are coupled to the circuit board 456A, side edges 457A of the circuit board 456A are disposed inward of side edges or surfaces 451A of the connectors 452A. Although not shown, in other embodiments, the side edges of a circuit board can be disposed outward of side edges or surfaces of the connectors. FIG. 27B illustrates a module 434B having a circuit board 456B and two connectors 452B coupled to the circuit board 456B. In this embodiment, when the connectors 452B are coupled to the circuit board 456B, side edges 457B of the circuit board 456B are disposed substantially flush with side edges or surfaces 451B of the connectors 452B.

As described above in the many examples of modules and systems, numerous modules may be coupled together to achieve various functionalities of the systems. Modules may be coupled in a cascading manner in which the inclusion of one module in the system may affect the functionality of downstream modules in a first manner and inclusion of a different module in the system may affect the function of downstream modules in another manner different than the first manner. That is, modules coupled together in a system may have dependencies upon one another to affect functionality thereof and of the entire system. A simple example to demonstrate this concept, but is not intended to be limiting, comprises a system include three modules: A power module, a button module, and an LED module. The button module and the LED module are dependent on the power module, and the LED module is dependent on the button module. To demonstrate the dependency of the button module and the LED module on the power module considering the following: If the power module is not providing any power, then neither the button module nor the LED module can operate in their intended manner. Similarly, to demonstrate the dependency of the LED module on the button module, if the button is not depressed or otherwise activated to close the circuit, the LED module will not be illuminated, and if the button is depressed, the LED module will be illuminated. In other words, cascading modules in a system affect operation and functionality of downstream modules.

The foregoing description has been presented for purposes of illustration and description, and is not intended to be exhaustive or to limit the invention to the precise form disclosed. The descriptions were selected to explain the principles of the invention and their practical application to enable others skilled in the art to utilize the invention in various embodiments and various modifications as are suited to the particular use contemplated. Although particular constructions of the present invention have been shown and described, other alternative constructions will be apparent to those skilled in the art and are within the intended scope of the present invention.

What is claimed is:

1. An educational apparatus, comprising:
    a first circuit board comprising an input interface and an output interface;
    a first magnetic connector mounted to the first circuit board; and
    a second magnetic connector mounted to the first circuit board such that an exterior end surface of the second magnetic connector is disposed substantially perpendicular to an exterior end surface of the first magnetic connector,
    the first magnetic connector including at least one first conductor configured to engage a second conductor on a third magnetic connector coupled to a second circuit board, the second magnetic connector including at least one third conductor configured to engage a fourth conductor on a fourth magnetic connector coupled to a third circuit board.

2. The educational apparatus of claim 1, wherein the first magnetic connector includes a first mounting portion configured to be removably coupled to a mounting board and a second mounting portion configured to be removably coupled to the mounting board, the second magnetic connector includes a first mounting portion configured to be removably coupled to the mounting board and a second mounting portion configured to be removably coupled to the mounting board.

3. The educational apparatus of claim 1, further comprising:
    a mounting board having a first side defining a plurality of openings and a second side including a plurality of projections, the first magnetic connector and the second magnetic connector each configured to be removably coupled to the first side of the mounting board, the second side of the mounting board configured to be removably coupled to at least one block having a projection and being from an interlocking block system.

4. The educational apparatus of claim 1, wherein the first magnetic connector has a first height and includes a first mounting portion and a second mounting portion each configured to be removably coupled to a mounting board, the apparatus further comprising:
    a first adapter configured to be coupled to a bottom surface of the first mounting portion; and
    a second adapter configured to be coupled to a bottom surface of the second mounting portion,
    the first magnetic connector having a second height when the first adapter and the second adapter are coupled to the first magnetic connector, the second height being greater than the first height.

5. The educational apparatus of claim 1, wherein the second magnetic connector includes a first mounting portion and a second mounting portion, the apparatus further comprising:
    the second circuit board;
    the third magnetic connector mounted to the second circuit board, the third magnetic connector of the second circuit board including a first mounting portion and a second mounting portion;
    the first mounting portion of the second magnetic connector configured to be removably coupled to a mounting board and the second mounting portion of the second magnetic connector configured to be removably coupled to the mounting board; and
    the first mounting portion of the third magnetic connector mounted to the second circuit board configured to be removably coupled to a mounting board and the second mounting portion of the third magnetic connector configured to be removably coupled to the mounting board.

6. The educational apparatus of claim 1, wherein the at least one first conductor of the first magnetic connector has an engagement portion configured to engage the second conductor on the third magnetic connector of the second circuit board, and has a coupling portion monolithically formed with the engagement portion.

7. An educational system, comprising:
    a first circuit board comprising a first input interface and a first output interface;
    a first magnetic connector including an exterior side surface and an exterior end surface different than the exterior side surface of the first magnetic connector, the first magnetic connector mounted to the first circuit board such that one of the first exterior side surface and the second exterior side surface of the first circuit board is substantially aligned in a same plane with the exterior side surface of the first magnetic connector, the first magnetic connector having a first conductor, a portion of the first conductor extending from the exterior end surface of the first magnetic connector;
    a second circuit board comprising a first input interface and a first output interface; and
    a second magnetic connector having an exterior side surface and an exterior end surface different than the exterior side surface of the second magnetic connector, the second magnetic connector mounted to the second circuit board such that one of the first exterior side surface and the second exterior side surface of the second circuit board is substantially aligned in a same plane with the exterior side surface of the second magnetic connector, the second magnetic connector having a second conductor, a portion of the second conductor extending from the exterior end surface of the second magnetic connector.

8. The educational system of claim 7, wherein the exterior end surface of the first magnetic connector and the exterior end surface of the second magnetic connector each includes a first elongate portion extending in a vertical direction and a second elongate portion extending in a horizontal direction, the first elongate portion of the first magnetic connector configured to contact the first elongate portion of the second magnetic connector, the second elongate portion of the first magnetic connector configured to contact the second elongate portion of the second magnetic connector when the first magnetic connector is coupled to the second magnetic connector.

9. The educational system of claim 7, further comprising:
a mounting board having a first side defining a plurality of openings and a second side including a plurality of projections,
the first magnetic connector and the second magnetic connector each configured to be removably coupled to the first side of the mounting board,
the second side of the mounting board configured to be removably coupled to at least one block having a projection and being from an interlocking block system.

10. The educational system of claim 7, wherein:
the first magnetic connector includes a first mounting portion configured to be received within a first opening from a plurality of openings defined in a mounting board and a second mounting portion configured to be received within a second opening from the plurality of openings defined in the mounting board to removably couple the first circuit board to the mounting board,
the second magnetic connector includes a first mounting portion configured to be received within the first opening in the mounting board and a second mounting portion configured to be received within the second opening in the mounting board to removably couple the second circuit board to the mounting board.

11. The educational system of claim 7, wherein the first magnetic connector has a first height and includes a first mounting portion and a second mounting portion each configured to be removably coupled to a mounting board, the educational system further comprising:
a first adapter configured to be coupled to a bottom surface of the first mounting portion; and
a second adapter configured to be coupled to a bottom surface of the second mounting portion,
the first magnetic connector having a second height when the first adapter and the second adapter are coupled to the first magnetic connector, the second height being greater than the first height.

12. The educational system of claim 7, wherein:
the first magnetic connector includes a first mounting portion configured to be received within a first opening defined in a support member and a second mounting portion configured to be received within a second opening defined in the support member,
the second magnetic connector includes a first mounting portion configured to be received within the first opening of the support member and a second mounting portion configured to be received within the second opening of the support member, the support member configured to maintain the first magnetic connector coupled to the second magnetic connector.

13. An educational system, comprising:
a circuit board having a first end surface and a second end surface;
a first magnetic connector having a first housing fixedly coupled directly to the circuit board at a first end portion of the circuit board, the first end portion including the first end surface of the circuit board, the first magnetic connector having a first mounting portion and a second mounting portion, the first mounting portion configured to be removably coupled to a mounting board, the second mounting portion configured to be removably coupled to the mounting board; and
a second magnetic connector having a second housing fixedly coupled directly to the circuit board at a second end portion of the circuit board, the second end portion including the second end surface of the circuit board, the second magnetic connector having a third mounting portion configured to be removably coupled to the mounting board and a fourth mounting portion configured to be removably coupled to the mounting board, the circuit board, the first magnetic connector and the second magnetic connector collectively having a length and configured to be collectively removably coupled to the mounting board such that (1) the first mounting portion and the second mounting member are each disposed at a first location along one of a length of the mounting board and (2) the third mounting portion and the fourth mounting portion are each disposed at a second location along the length of the mounting board, a distance between the first location and the second location substantially coinciding with the collective length of the circuit board, the first magnetic connector and the second magnetic connector.

14. The educational system of claim 13, further comprising:
the mounting board, the mounting board configured to be removably coupled to at least one block from an interlocking block system.

15. The educational system of claim 13, wherein the circuit board is a first circuit board, the educational system further comprising:
a second circuit board; and
a magnetic connector coupled to the second circuit board, the magnetic connector including a first mounting portion configured to be removably coupled to the mounting board and a second mounting portion configured to be removably coupled to the mounting board to removably couple the second circuit board to the mounting board.

16. The educational system of claim 13, wherein the first magnetic connector has a front surface and a conductor, at least a portion of the conductor extending from the front surface of the first magnetic connector and configured to engage a conductor on a magnetic connector coupled to a second circuit board.

17. The educational system of claim 13, wherein the first magnetic connector has a first height, the educational system further comprising:
a first adapter configured to be coupled to a bottom surface of the first mounting portion; and
a second adapter configured to be coupled to a bottom surface of the second mounting portion,
the first magnetic connector having a second height when the first adapter and the second adapter are coupled to the first magnetic connector, the second height being greater than the first height.

18. The educational system of claim 13, wherein the first housing of the first magnetic connector and the second housing of the second magnetic connector each includes a first housing portion coupled to a second housing portion.

19. The educational system of claim 13, further comprising:
at least one electrical component disposed on a top surface of the circuit board and between the first magnetic connector and the second magnetic connector such that the electrical component is visibly and physically accessible to a user.

20. The educational system of claim 13, wherein:
the first mounting portion and the second mounting portion of the first magnetic connector complimentarily mate with a first portion of the mounting board and a second portion of the mounting board, respectively, the third mounting portion and the fourth mounting portion of the second magnetic connector complimentarily mate with a third portion of the mounting board and a fourth portion of the mounting board, respectively.

\* \* \* \* \*